United States Patent
Nagai

(10) Patent No.: US 7,009,242 B2
(45) Date of Patent: Mar. 7, 2006

(54) NON-VOLATILE SEMICONDUCTOR STORAGE APPARATUS WITH OVERLAPPING GATES AND MANUFACTURING METHOD THEREOF

(75) Inventor: Takaaki Nagai, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/837,734

(22) Filed: Apr. 17, 2001

(65) Prior Publication Data

US 2001/0054735 A1    Dec. 27, 2001

(30) Foreign Application Priority Data

Apr. 19, 2000    (JP)    .............................. 2000-117677

(51) Int. Cl.
*H01L 29/788*    (2006.01)

(52) U.S. Cl. ..................... 257/315; 257/314; 257/326

(58) Field of Classification Search ................ 257/315, 257/314, 316, 317, 319–326

See application file for complete search history.

(56) References Cited

U.S. PATENT DOCUMENTS

| | | | | |
|---|---|---|---|---|
| 4,907,198 A | * | 3/1990 | Arima | 365/185.12 |
| 5,100,818 A | * | 3/1992 | Arima et al. | 438/265 |
| 5,445,983 A | * | 8/1995 | Hong | 438/258 |
| 5,604,367 A | * | 2/1997 | Yang | 257/321 |
| 5,963,806 A | * | 10/1999 | Sung et al. | 438/266 |
| 6,091,634 A | * | 7/2000 | Wong | 365/185.14 |
| 6,222,227 B1 | * | 4/2001 | Chen | 257/316 |
| 6,326,661 B1 | * | 12/2001 | Dormans et al. | 257/315 |
| 2001/0001490 A1 | * | 5/2001 | Sung et al. | 257/316 |

FOREIGN PATENT DOCUMENTS

JP    09-129759    5/1997

* cited by examiner

*Primary Examiner*—Douglas W. Owens
(74) *Attorney, Agent, or Firm*—Katten Muchin Rosenman LLP

(57) ABSTRACT

A memory cell array is provided at a non-volatile semiconductor storage apparatus. In a memory cell array, the unit cell includes a memory cell field effect transistor and a select field effect transistor. The memory cell field effect transistor has a floating gate and a control gate. The select field effect transistor has a drain connected to a source of the memory cell field effect transistor. The floating gate and control gate extends to a position above a gate of the select field effect transistor.

9 Claims, 26 Drawing Sheets

PRIOR ART

PRIOR ART ized, whereby a tunnel gate oxide film 155 is formed in a region that is to be an active region. Further, a polysilicon film 156 is stacked on the tunnel gate oxide film 155, and the polysilicon film 156 on a linearly formed field insulation film 154 is removed in a slit shape by means of etching. Next, an oxide film, a nitride film, and an oxide film are stacked on the polysilicon film 156, thereby forming an ONO film 165. Thereafter, a polysilicon film 166 is fully stacked. Further, a photo-resist film 167 is formed on the polysilicon film 166, and this photo-resist film 167 is patterned in the shape of the gate electrode of each memory cell transistor.

NON-VOLATILE SEMICONDUCTOR STORAGE APPARATUS WITH OVERLAPPING GATES AND MANUFACTURING METHOD THEREOF

BACKGROUND OF THE INVENTION

1. Field of the Invention

The present invention relates to a non-volatile semiconductor storage apparatus for use in a flash memory or the like and a manufacturing method therefore. More particularly, the present invention relates to a non-volatile semiconductor storage apparatus for improvement of a memory cell capacity and a manufacturing method therefore.

2. Description of the Related Art

Conventionally, a variety of non-volatile semiconductor storage apparatuses are such that one memory cell transistor is provided at one unit cell, and one memory cell transistor and one select transistor are provided at one unit cell.

FIG. 1A to FIG. 1C are sectional views showing a conventional method of manufacturing a non-volatile semiconductor storage apparatus in which one memory cell transistor and one select transistor are provided at one unit cell in order of steps. In addition, FIG. 2 is a layout showing a non-volatile semiconductor storage apparatus manufactured by the methods shown in FIG. 1A to FIG. 1C. The sectional views shown in FIG. 1A to FIG. 1C show sectional views, each of which indicates a position along line D—D in FIG. 2.

In this conventional manufacturing method, a plurality of field insulation films 104 for element separation are first formed in an island shape on a surface of a silicon substrate 101. Next, as shown in FIG. 1A, a surface of the silicon substrate 101 is thermally oxidized, whereby a tunnel gate oxide film 105 is formed in a region that is to be an active region. Further, a polysilicon film 106 is stacked on the tunnel gate oxide film 105. Next, a portion that is to be a gate of a memory cell transistor of the polysilicon film 106 is etched in a slit shape.

Next, as shown in FIG. 1A, an oxide film, a nitride film, and an oxide film are stacked in order on the polysilicon film 106, thereby forming an ONO film 115. Thereafter, a polysilicon film 116 is fully stacked. Further, a photo-resist film 117 is formed on the polysilicon film 116, and this photo-resist film 117 is patterned in the shape of the gate electrode of each transistor.

Then, as shown in FIG. 1B, the photo-resist film 117 is defined as a mask, and the polysilicon film 116, ONO film 115, polysilicon film 106, and tunnel oxide film 105 are sequentially removed in order by etching through self-alignment. Next, N-type impurities, for example, arsenic (As) is ion-implanted into the silicon substrate 101, and an N$^+$ diffusion film 109 is formed as an active region. Of the N$^+$ diffusion layer 109, an N$^+$ diffusion layer 109$a$ in FIG. 1B is obtained as a source diffusion layer, and an N$^+$ diffusion layer 109$b$ in FIG. 1B is obtained as a drain diffusion layer. Thereafter, an oxide film is fully stacked, and the stacked film is etched back, thereby forming a side wall 118. Next, a transistor with an LDD structure is formed by carrying out ion-implantation with high density. In two transistors sandwiching the N$^+$ diffusion layer 109$a$, the polysilicon films 106 and 116 sandwiching the ONO film 115 are connected to each other.

Then, as shown in FIG. 1C, an interlayer insulation film 119 is fully stacked; a contact hole 120 reaching the N+diffusion layer 109$b$, which is a drain, is formed in the interlayer insulation film 119; a wiring layer 121 is embedded in this contact hole 120; and further, a wiring layer 122 commonly connecting the wiring layer 121 in a transverse direction is formed as a bit line.

FIG. 3A to FIG. 3D are sectional views showing a conventional method of manufacturing an non-volatile semiconductor storage apparatus in which one memory cell transistor is provided at one unit cell in order of steps. In addition, FIG. 4 is a layout showing a non-volatile semiconductor storage apparatus manufactured by using a method shown in FIG. 3A to FIG. 3D. FIG. 3A to FIG. 3D show sectional views, each of which indicates a position taken along line E—E in FIG. 4.

In this conventional manufacturing method, a plurality of field insulation films 154 for element separation extending in a transverse direction is linearly formed on a surface of a silicon substrate 151. Next, as shown in FIG. 3A, a surface of the silicon substrate 151 is thermally oxidized, whereby a tunnel gate oxide film 155 is formed in a region that is to be an active region. Further, a polysilicon film 156 is stacked on the tunnel gate oxide film 155, and the polysilicon film 156 on a linearly formed field insulation film 154 is removed in a slit shape by means of etching. Next, an oxide film, a nitride film, and an oxide film are stacked on the polysilicon film 156, thereby forming an ONO film 165. Thereafter, a polysilicon film 166 is fully stacked. Further, a photo-resist film 167 is formed on the polysilicon film 166, and this photo-resist film 167 is patterned in the shape of the gate electrode of each memory cell transistor.

Then, as shown in FIG. 3B, the photo-resist film 167 is defined as a mask, the polysilicon film 166, the ONO film 165 and polysilicon film 156, and the tunnel gate oxide film 155 are sequentially removed by etching through self-alignment. Next, N-type impurities, for example, arsenic (As) is ion-implanted in the silicon substrate 151, whereby the N$^+$ diffusion layer 159 is formed as an active region. Of the N$^+$ diffusion layer 159, an N$^+$ diffusion layer 159$a$ in FIG. 3B is obtained as a source diffusion layer, and an N$^+$ diffusion layer 159$b$ in FIG. 3B is obtained as a drain diffusion layer. Thereafter, an oxide film is fully stacked, and the stacked film is etched back, thereby forming a side wall 168. Next, a transistor with an LDD structure is formed by carrying out ion-implantation with high density.

Next, as shown in FIG. 3C, a silicon oxide film 161 is fully stacked.

Next, as shown in FIG. 3D, an opening reaching the N$^+$ diffusion layer 159 is formed in the silicon oxide film 161 on the drain and source regions, and then, a polysilicon film 163 is fully stacked. Then, the polysilicon film 163 is connected by a polysilicon film 163$b$ in parallel to a word line on the drain region so as to dispose the polysilicon stay 163$a$ at the individual openings on the drain region, and is patterned so as to be a common source line. Thereafter, an interlayer insulation film 169 is fully laminated; a contact hole 170 reaching the polysilicon stay 163 is formed; a wiring layer 171 is embedded in the contact hole 170, and further, a wiring layer 172 commonly connecting the wiring layer 171 in a transverse direction is formed as a bit line.

In the non-volatile semiconductor storage apparatus manufactured by these methods, while an element becomes finer and a voltage is lowered, a capacity between a control gate and a floating gate of a memory cell transistor is so small that a sufficient coupling capacity cannot be obtained. Thus, a high voltage is required for that operation, making it impossible to cope with a recent requirement for a reduced operating voltage and leading to an increase in a step for increasing an area for a pressure rise circuit for generating an operating voltage and an increase in a step for generating a pressure rise circuit. In addition, a gate oxide film and an ONO film are thin-filmed, thereby making it possible to improve a coupling capacity. However, in this method, the reliability of a memory cell may be lost due to generation of a leak current or the like, and thus, there is a restriction on thin filming.

On the other hand, there is proposed an AND-type semiconductor non-volatile memory in which a pair of source and drain regions and two channel regions are provided in one unit cell; a select gate, a floating gate and a control gate are provided in order from the lower part per one of the two channel regions; and the floating gate is used as a gate in the other channel region (Japanese Patent Application Laid-open No. Hei 9-129759). FIG. 5 is a sectional view showing a conventional semiconductor non-volatile memory described in Japanese Patent Application Laid-open No. Hei 9-129759.

In the conventional semiconductor non-volatile memory proposed in this publication, as shown in FIG. 5, a source region 202 and a drain region 203 are formed at a surface of a semiconductor substrate 201; a select gate 204 is formed via a gate insulation film 211 at a position eccentric at the source region 202 side on a channel region sandwiched by the source region 202 and the drain region 203; and a floating gate 205 is formed via a gate insulation film 212 at a position eccentric at the drain region 203 side. This floating gate 205 extends upwardly of the select gate 204 via an insulation film 214. These are covered with an insulation film 213, and a control gate 206 is formed on this insulation film 213.

According to the thus configured conventional semiconductor non-volatile memory, an area in which the control gate 206 is superimposed on the floating gate 205 is greater than an area in which the floating gate 205 is superimposed on the select gate 204, thus making it possible to increase a coupling capacity without increasing an area for a unit cell. In addition, one drain contact is shared by 128 unit cells, for example, thus making it possible to reduce the cell area.

However, in a conventional semiconductor non-volatile memory shown in FIG. 5, in order to form the floating gate 205 and the select gate 204, when a polysilicon film is patterned in batch, a drain side semiconductor substrate 201 is also etched. Therefore, a fault may occur in this region, and a malfunction may occur due to generation of a leak current in a diffusion layer that configures the drain region 203. On the other hand, in the case where the floating gate 205 and the select gate 204 are formed in another step in order to prevent this fault or malfunction, a pattern shift or non-uniformity occurs, and the characteristics becomes easily non-uniform. Thus, it is improper to ensure fining. In addition, the channel length of a transistor having the gate oxide film 212 and a channel length of a transistor having a gate oxide film 211 are also easily made non-uniform. Thus, there is a problem that the characteristics are easily made non-uniform. In addition, in an AND-type semiconductor non-volatile memory, the drain and source of each of a number of transistors are formed in a common diffusion layer, and are connected to a wiring layer at an end of the diffusion layer. Thus, there is a problem that a parasitic resistance in the source and drain is large.

SUMMARY OF THE INVENTION

It is an object of the present invention to provide a non-volatile semiconductor storage apparatus and a manufacturing method thereof capable of increasing a coupling capacity between a floating gate and a control gate, and reducing an operating voltage while preventing malfunction caused by a leak current, the non-uniformity of characteristics, and the non-uniformity of manufacturing.

According to one aspect of the present invention, a non-volatile semiconductor storage apparatus comprises a memory cell array. The unit cell includes a memory cell field effect transistor and a select field effect transistor. The memory cell field effect transistor has a floating gate and a control gate. The select field effect transistor has a drain connected to a source of the memory cell field effect transistor. The floating gate and control gate extends to a position above a gate of the select field effect transistor.

According to another aspect of the present invention, a non-volatile semiconductor storage apparatus comprises a memory cell array. The unit cell includes a memory cell field effect transistor and a select field effect transistor. The memory cell field effect transistor has a floating gate and a control gate. The select field effect transistor has a drain connected to a source of the memory cell field effect transistor. The non-volatile semiconductor storage apparatus is provided with: a first semiconductor layer composing a portion of the floating gate and a gate of the select field effect transistor; a second semiconductor layer formed on the first semiconductor layer in the memory cell field effect transistor, composing another portion of the floating gate and extending to a position above the gate of the select field effect transistor; a first insulation layer which insulates the first semiconductor layer from the second semiconductor layer in the select field effect transistor; a second insulation layer formed on the second semiconductor layer; and a third semiconductor layer formed on the second insulation layer and composing the control gate.

In the present invention, the floating gate and control gate extend upwardly of a gate of the select field effect transistor, thus making it possible to ensure a large coupling capacity between the floating gate and the control gate. Thus makes it possible to reduce an operating voltage while preventing a malfunction. In addition, a memory cell field effect transistor and a select field effect transistor are provided at the unit cell. These gates can be formed in patterning caused by self-alignment, and thus, the non-uniformity of characteristics caused by a pattern shift can be prevented.

At the non-volatile semiconductor storage apparatus, if there are provided with a source line commonly connecting sources of the select field effect transistors arranged in a first direction and a semiconductor layer connecting the source and the source line for the each select field effect transistor, making it possible to reduce a cell size and reduce the number of manufacturing steps.

Further, the non-volatile semiconductor storage apparatus is a NOR-type one sharing a drain diffusion layer between adjacent memory cell field effect transistors in a second direction in the unit cells, thereby enabling connection to a line with low resistance for each of the two memory cell field effect transistors. Therefore, a parasitic resistance is reduced, enabling high-speed random readout.

According to another aspect of the present invention, a manufacturing method of a non-volatile semiconductor storage apparatus having a memory cell array having unit cells, the unit cell including a memory cell field effect transistor and a select field effect transistor, the memory cell field effect transistor having a floating gate and a control gate, and the select field effect transistor having a drain connected to a source of the memory cell field effect transistor, the method comprising the steps of: forming a portion of the floating gate of a same semiconductor layer as a gate of the select field effect transistor; forming another portion of the floating gate to extend to a portion above the gate of the select field effect transistor; and forming the control gate so as to be superimposed on the floating gate in a planar view.

According to such a manufacturing method, the number of steps for forming a source contact of a select field effect transistor is reduced.

DESCRIPTION OF THE PREFERRED EMBODIMENT

Figure 1A:
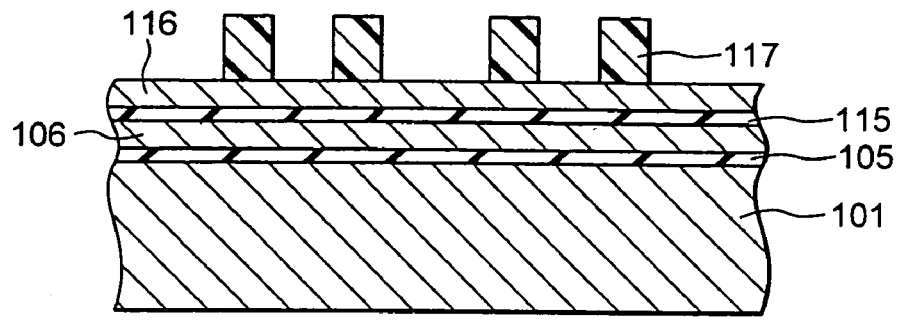
FIG. 1A to FIG. 1C are sectional views each showing a conventional method of manufacturing a non-volatile semiconductor storage apparatus in which one memory cell transistor and one select transistor are provided in one unit cell in order of steps.
Figure 1B:
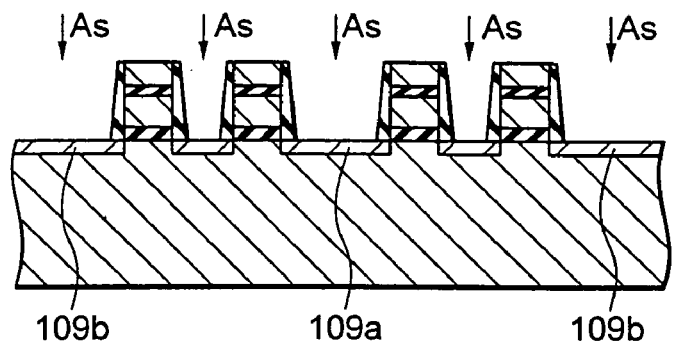
Figure 1C:
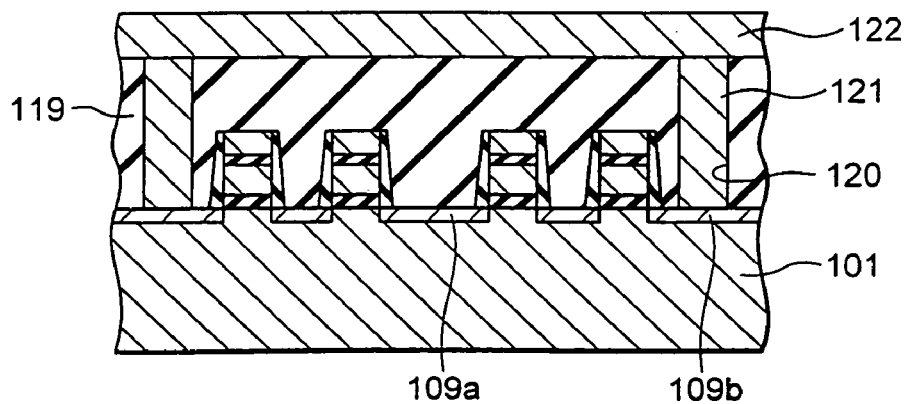
Figure 2:
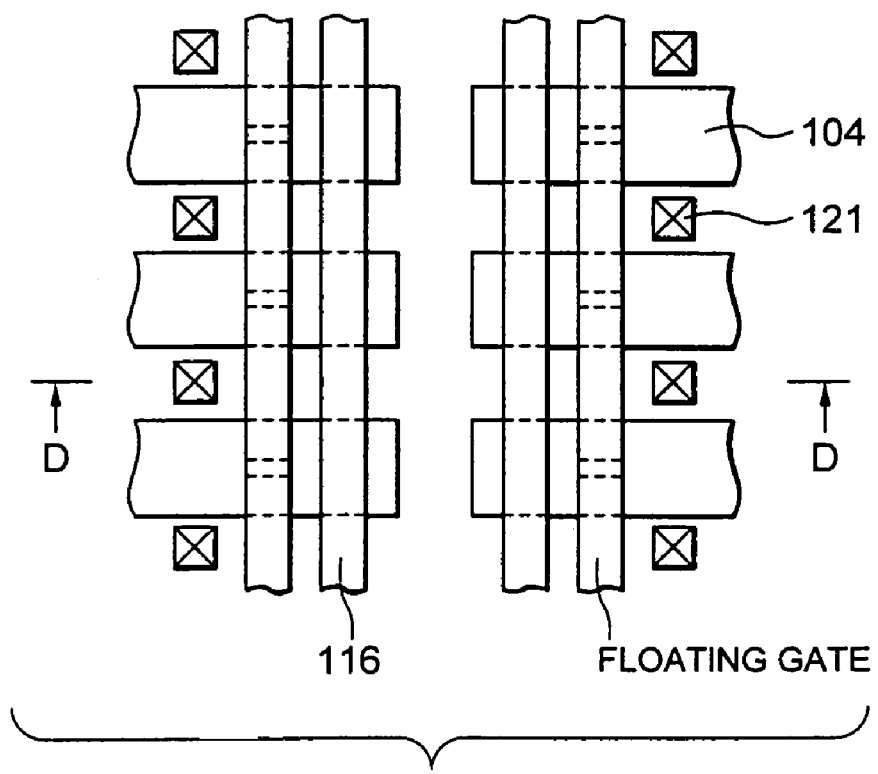
FIG. 2 is a layout showing a non-volatile semiconductor storage apparatus manufactured by the method shown in FIG. 1A to FIG. 1C.
Figure 3A:
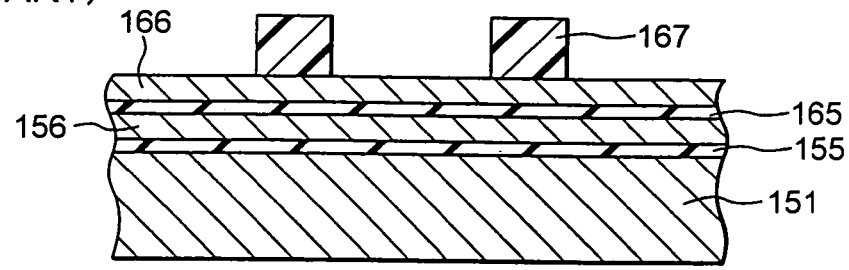
FIG. 3A to FIG. 3D are sectional views each showing a conventional method of manufacturing a semiconductor storage apparatus in which one memory cell transistor is provided in one unit cell in order of steps.
Figure 3B:
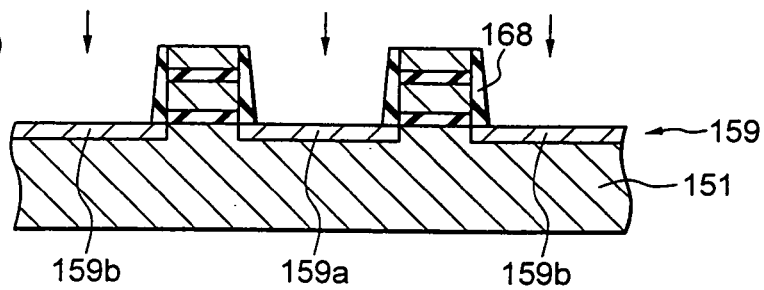
Figure 3C:
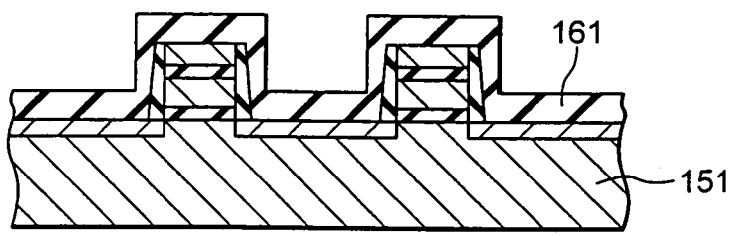
Figure 3D:
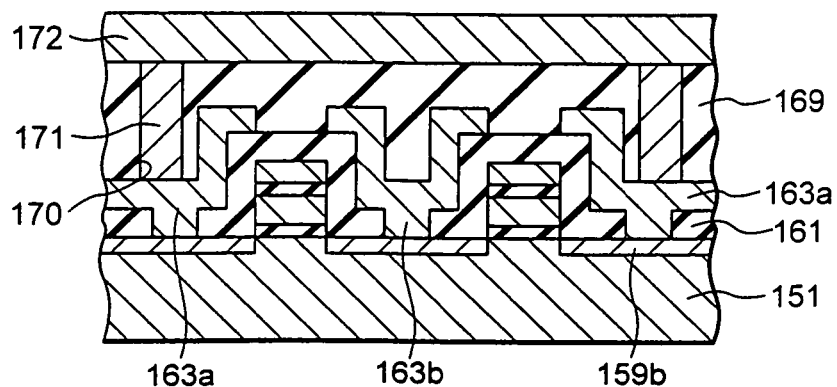
Figure 4:
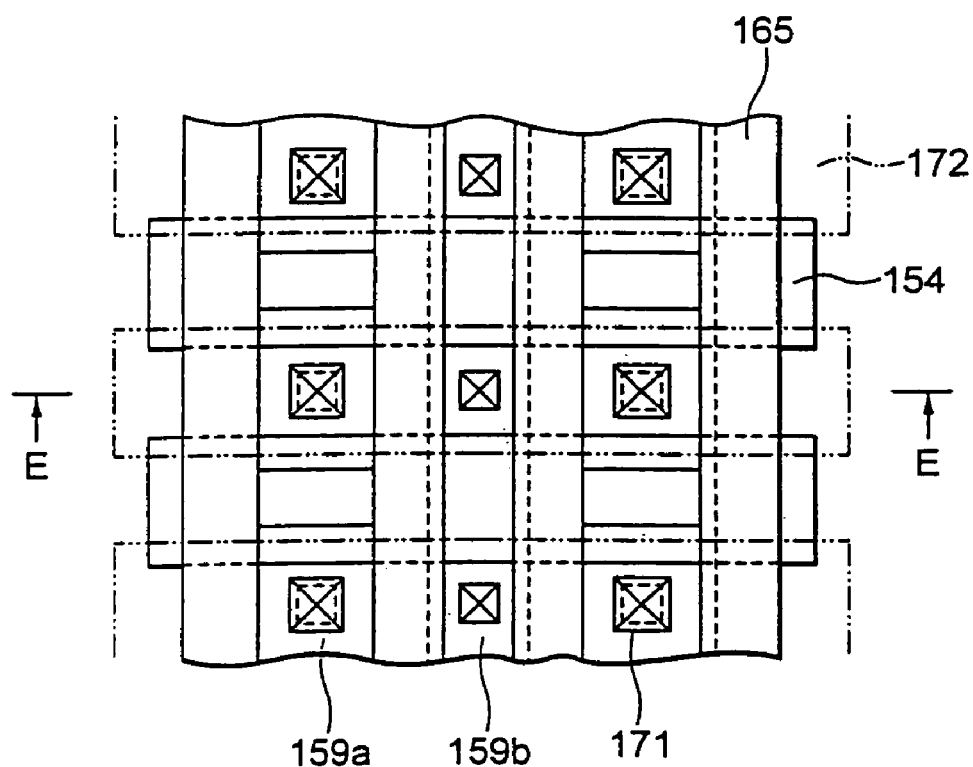
FIG. 4 is a layout showing the non-volatile semiconductor storage apparatus manufactured by the method shown in FIG. 3A to FIG. 3D.
Figure 5:
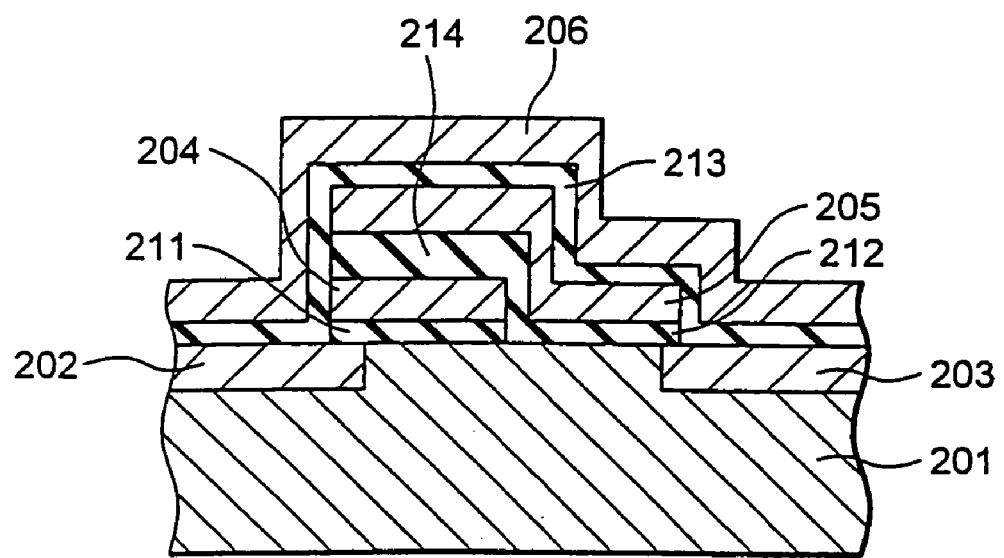
FIG. 5 is a sectional view showing a conventional semiconductor non-volatile memory described in Japanese Patent Application Laid-open No. Hei 9-129759.
Figure 6:
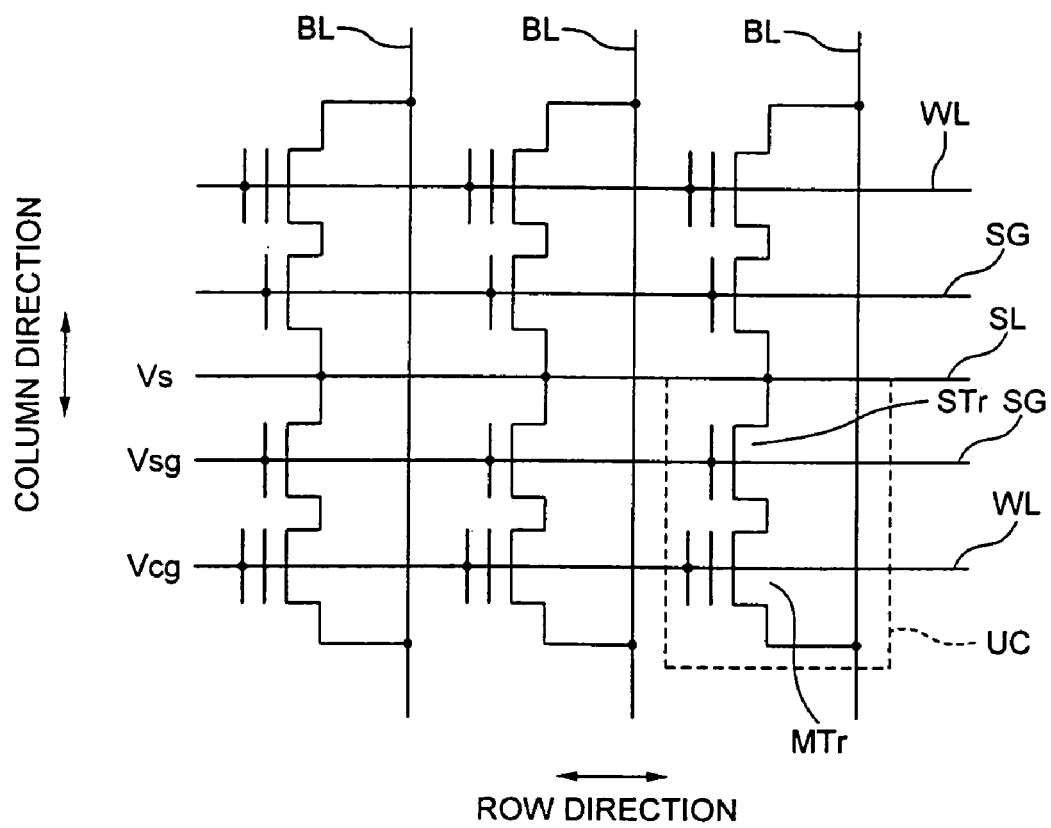
FIG. 6 is a circuit diagram showing a non-volatile semiconductor storage apparatus manufactured according to an embodiment of the present invention.

Hereinafter, preferred embodiments of the present invention will be described with reference to the accompanying drawings. FIG. 6 is a circuit diagram showing a non-volatile semiconductor storage apparatus manufactured according to an embodiment of the present invention;

In a non-volatile semiconductor storage apparatus manufactured according to an embodiment of the present invention, a plurality of unit cells UC are arranged in a matrix manner. One unit cell US is composed of, for example, one memory cell transistor MTr and one select transistor STr. The memory cell transistor MTr and select transistor STr are field effect transistors. A memory cell transistor MTr and a select transistor STr are disposed symmetric with respect to a line between the adjacent two unit cells in columnar direction, and a transverse position between the memory cell transistor MTr and the select transistor STr coincides with another between the unit cells UC consisting of lines. In this way, the unit cells UC are arranged in a NOR-type.

A control gate and a floating gate are provided in the memory cell transistor MTr, and each control gate of the memory cell transistor MTr which consists of a row is commonly connected to a word line WL that extends in the row direction. In addition, each gate of the select transistor STr which consists of a row is commonly connected to the select gate line SG that extends in the row direction. Further, each source of the select transistor Str which consists of a row is commonly connected to a source line SL that extends in the row direction. This source line SL is shared between the adjacent select transistors STr.

In addition, each drain of the memory cell transistor MTr which consists of a column is commonly connected to a bit line BL which extends in the columnar direction.

A voltage Vs is supplied to the source line SL; a voltage Vsg is supplied to the select gate line SG; a voltage Vcg is supplied to the word line WL; and readout and writing of data in a memory cell transistor MTr are performed via the bit line BL.

FIG. 7A to FIG. 7I are sectional views each showing a method of manufacturing a non-volatile semiconductor storage apparatus according to a first embodiment of the present invention in order of steps. FIG. 8A to FIG. 8E are layouts each showing a method of manufacturing a non-volatile semiconductor storage apparatus according to the first embodiment in order of steps. FIG. 7A to FIG. 7I are sectional views each showing a position taken along line A—A in FIG. 8A to FIG. 8E.

Figure 7A:
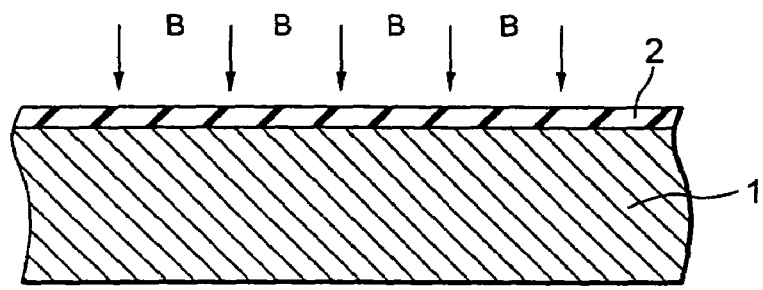
FIG. 7A to FIG. 7I are sectional views each showing a method of manufacturing a non-volatile semiconductor storage apparatus according to a first embodiment of the present invention in order of steps.

In the first embodiment, as shown in FIG. 7A, a silicon oxide film 2 is first formed on a surface of a P-type silicon substrate 1. Next, for example, boron is ion-implanted in the P-type silicon substrate at the implantation energy of about 100 keV and at the dosage of about $10^{13}$ atoms/cm$^2$. Thereafter, heat treatment is carried out at a temperature of about 1000° C.

Figure 7B:
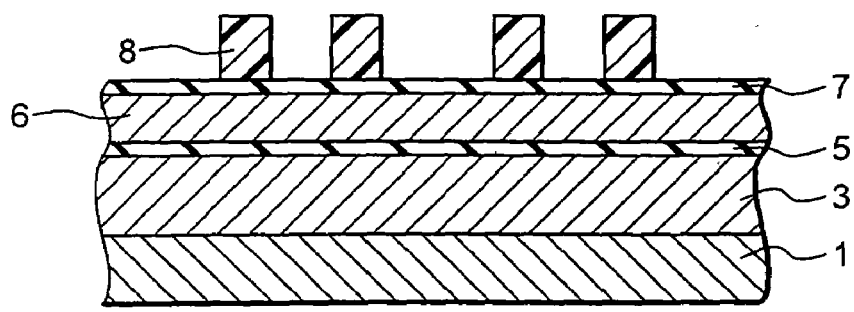
Figure 8A:
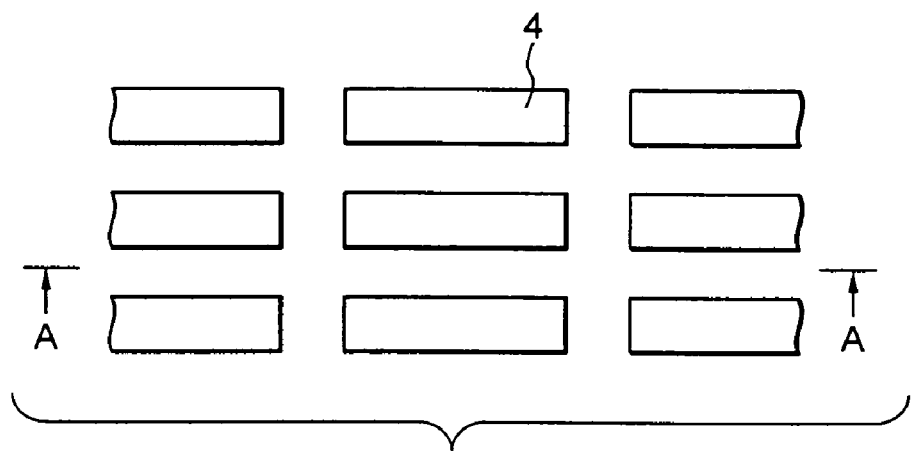
FIG. 8A to FIG. 8E are layouts each showing a method of manufacturing a non-volatile semiconductor storage apparatus according to a first embodiment of the present invention in order of steps.
Figure 9A:
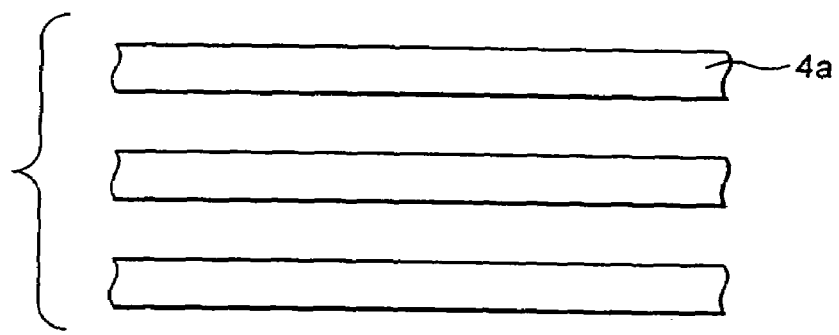
FIG. 9A to FIG. 9C are layouts each showing a relationship between each embodiment and a polysilicon film when using a linear filed insulation film.

As a result, as shown in FIG. 7B, a P well 3 is formed underneath the silicon oxide film 2. A memory cell array in which a unit cell UC is arranged in a lattice shape is to be formed in the P well 3. Next, a plurality of field insulation films 4 for element separation are formed on a surface of the P-type silicon substrate 1 so as to be orthogonal to the word line WL. At this time, the field insulation film 4 may be regularly disposed longitudinally and transversely, for example, as shown in FIG. 8A. This film may be regularly disposed in a linearly shape extending in a transverse direction, as shown in FIG. 9A. In addition, the thickness of the field insulation film 4 is about 4000 to 8000 Angstroms, for example.

Next, as shown in FIG. 7B, the surface of the P-type silicon substrate is thermally oxidized at about 800 to 900° C., whereby a tunnel gate oxide film 5 with the thickness of about 100 Angstroms is formed in a region that is to be an active region. Further, a polysilicon film 6 is stacked on the tunnel gate oxide film 5 by using a low pressure CVD (chemical vapor deposition) method. The film thickness of the polysilicon film 6 is about 1000 to 2000 Angstroms, for example, and is to be a portion of a floating gate of the memory cell transistor MTr and a gate of the select transistor STr in accordance with the subsequent steps. Next, phosphor is doped in the poly-silicon film 6 by a thermal diffusion, ion-implantation technique or the like, thereby reducing the resistance of the polysilicon film 6. Then, a silicon nitride film 7 is stacked on the polysilicon film 6 by using a low pressure CVD method. The thickness of the silicon nitride film 7 is about 1000 to 2000 Angstroms, for example. Sequentially, a photo-resist film 8 is formed on the silicon nitride film 7, and this photo-resist film 7 is patterned so as to retain in a predetermined region in which a gate is formed by lithography. At this time, four predetermined regions in which a gate is formed exist per one field insulation film 4, the external two are obtained as select transistors Str, and the internal two are obtained as select cell transistors MTr.

Figure 7C:
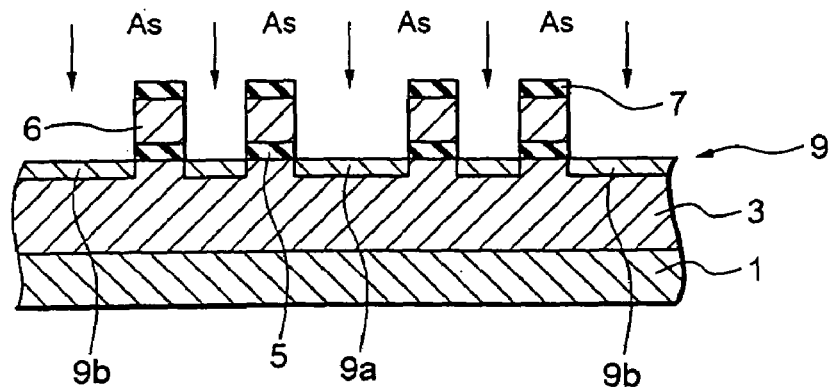
Figure 8B:
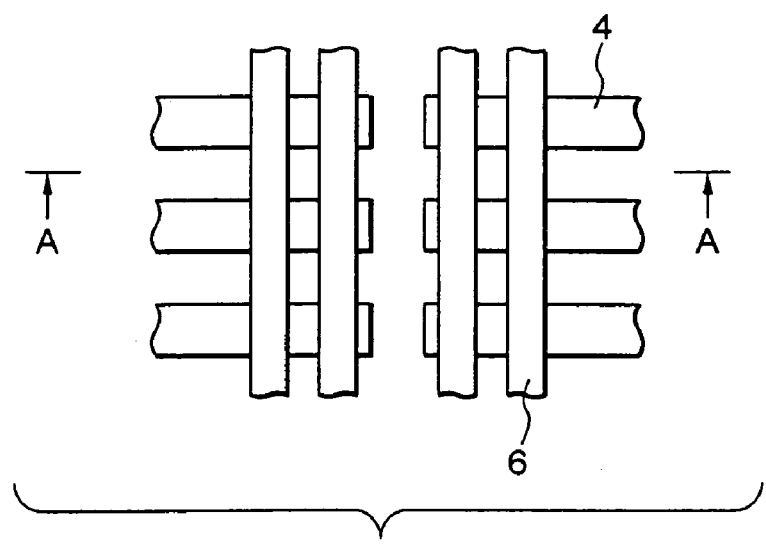

As shown in FIG. 7C and FIG. 8B, the photo-resist film 8 is defined as a mask, and the silicon nitride film 7, polysilicon film 6, and tunnel gate oxide film 5 are sequentially etched in a direction vertical to the field insulation film 4. Further, N-type impurities, for example, arsenic (As) are ion-implanted into the exposed P-type well 3 at the implantation energy of 50 keV and at the dosage of about $10^{15}$ atoms/cm$^2$, whereby an N$^+$ diffusion layer 9 is formed as an active region. Of the N$^+$ diffusion layer 9 in FIG. 7C, an N$^+$ diffusion layer 9a is obtained as a source diffusion layer, and an N$^+$ diffusion layer 9b is obtained as a drain diffusion layer.

Figure 7D:
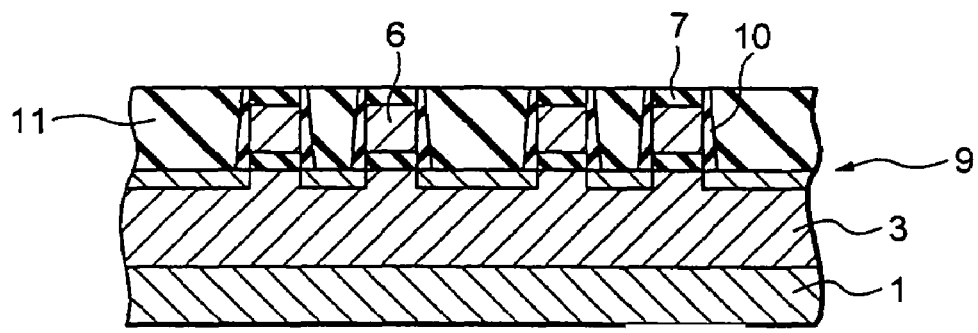

Next, a silicon nitride film is fully stacked with thickness of about 1000 to 2000 Angstroms, for example, and anisotropic etching is applied to this silicon nitride film, whereby a side wall 10 composing of a nitride film is formed laterally of the residual polysilicon oxide film 6, as shown in FIG. 7D. Further, a silicon oxide film 11 is fully stacked with the thickness of about 3000 to 5000 Angstroms, for example, and the stacked film is removed by etching using a CMP (chemically and mechanically polishing) technique until the silicon nitride film 7 on the polysilicon film 6 has been exposed. During previous arsenic ion-implantation shown in FIG. 7C, the implantation energy may be set as 40 keV and a dosage of $10^{13}$ atoms/cm$^2$, and further, after forming of the side wall 10, arsenic may be ion-implanted at the implantation energy of 50 keV, for example, and a dosage of $10^{15}$ atoms/cm$^2$, whereby the source and drain may have a lightly doped drain structure (LDD).

Figure 7E:
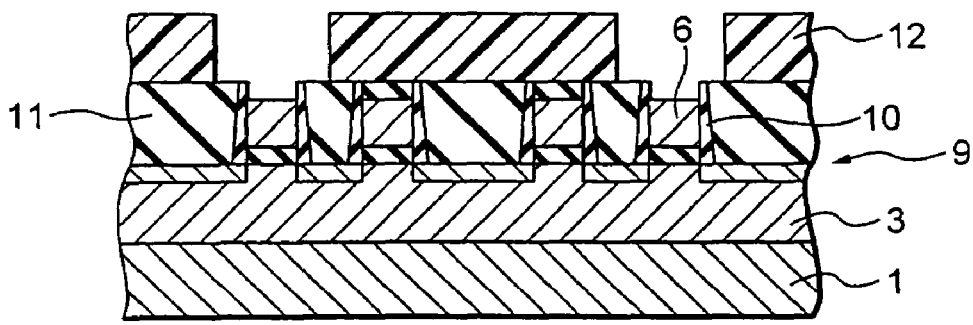

Next, as shown in FIG. 7E, a photo-resist film 12 is fully formed, and a photo-resist film 12 in a predetermined region in which the memory cell transistor MTr is to be formed is patterned by lithography technique. Then, the photo-resist film 12 is defined as a mask, and the exposed silicon nitride film 7 is removed by etching.

Figure 7F:
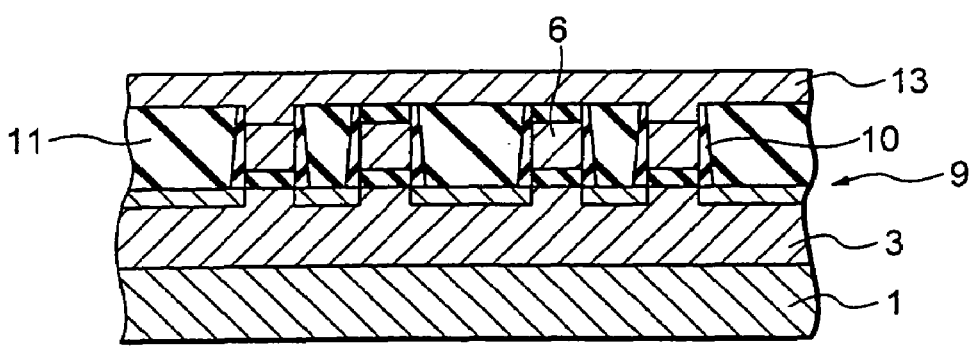

Then, as shown in FIG. 7F, the photo-resist film 12 is released, and a polysilicon film 13 is fully stacked by a low pressure CVD method. The film thickness of the polysilicon film 13 is about 1000 to 2000 Angstroms, for example. Next, phosphor is doped in the polysilicon film 13 by thermal diffusion, ion-implantation technique or the like, thereby reducing the resistance of the polysilicon film 13.

Figure 8C:
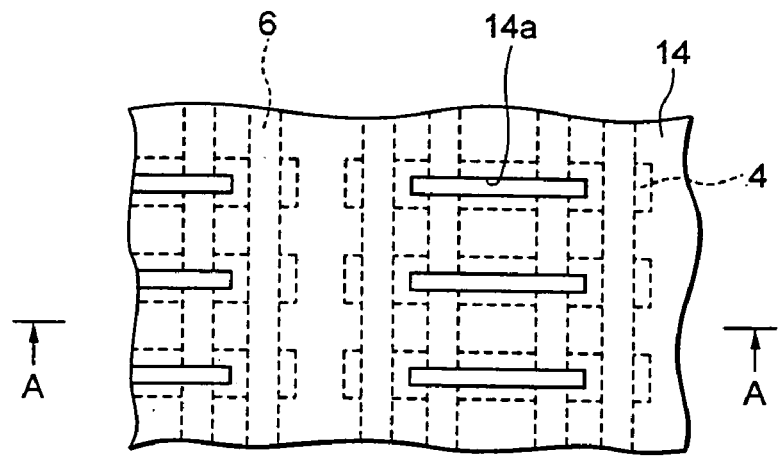

Sequentially, as shown in FIG. 8C, a photo-resist film 14 is formed on the polysilicon film 13, and the formed photo-resist film 14 is patterned by lithography technique in the shape there is provided a slit-shaped opening 14a that crosses internal two polysilicon films 6 per one field insulation film 4 in a planar view. The photo-resist film 14 is defined as a mask, and the polysilicon films 6 and 13 on the field insulation film 4 are removed by etching in a slit shape.

Figure 7G:
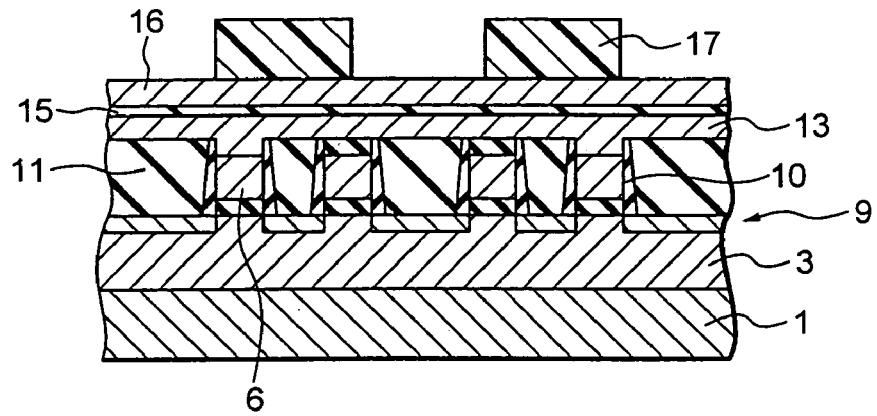

Next, as shown in FIG. 7G, a first HTO film (high temperature oxide film), a silicon oxide film and a second HTO film are fully stacked sequentially, thereby forming an ONO film 15. This ONO film 15 is obtained as an insulation film between a floating gate and a control gate in the memory cell transistor MTr. The first HTO film may be formed at the thickness of about 60 Angstroms, for example, by using a high temperature low pressure CVD method. The silicon nitride film may be formed at the thickness of about 80 Angstroms, for example, by using a low pressure CVD method. The second HTO film may be formed with the thickness of about 100 Angstroms, for example, by using a high temperature low pressure CVD method. Further, a polysilicon film 16 is stacked on the ONO film 15 by using the low pressure CVD method. The thickness of the polysilicon film 16 is about 1000 to 2000 Angstroms, for example. Next, phosphor is doped in the polysilicon film 16 by thermal diffusion, ion-implantation technique or the like, thereby reducing the resistance of the polysilicon film 16. Then, a photo-resist film 17 is formed on the polysilicon film 16, and this photo-resist film 17 is patterned so as to be left in the form in which the select transistor STr is covered with the resist film from the memory cell transistor MTr or in the form in which resist film reaches the select transistor Str. After doping of phosphor, a tungsten (WSi) film may be formed, whereby a gate may be poly-side structured.

Figure 7H:
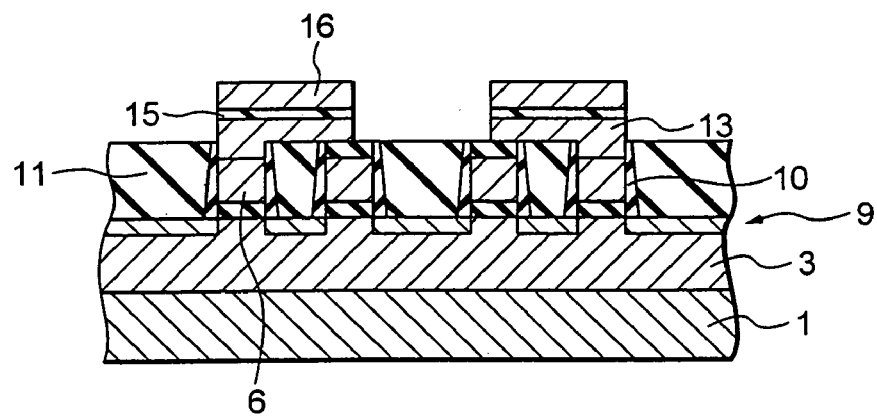
Figure 8D:
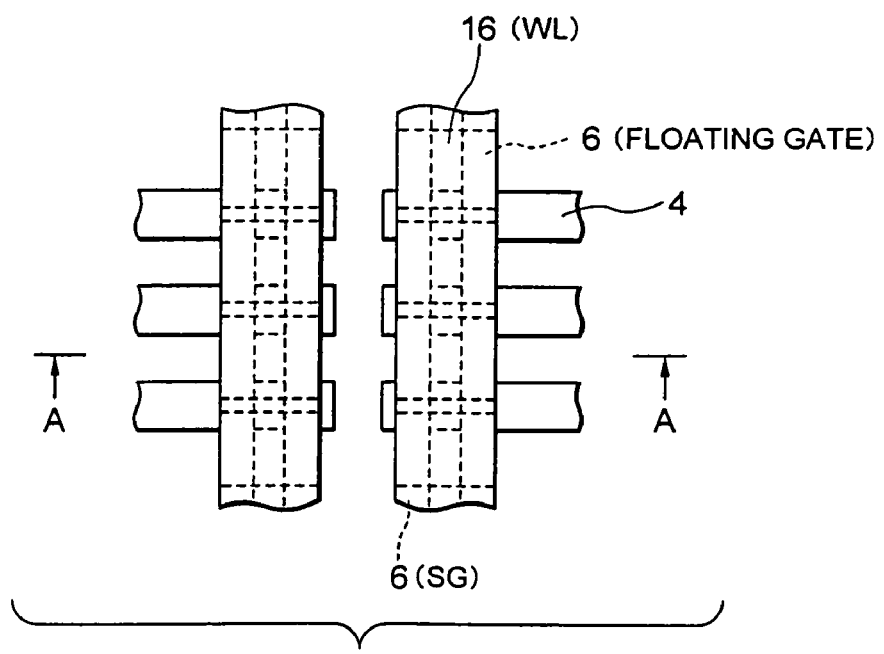

Then, as shown in FIG. 7H and FIG. 8D, the photo-resist film 17 is defined as a mask; and the polysilicon film 16, ONO film 15, and polysilicon film 13 are sequentially removed by etching. The floating gate and control gate of the memory cell transistor MTr are superimposed on each other in a region enclosed in dotted line in FIG. 8D.

Here, a gate electrode (not shown) of a transistor which configures a logical circuit in a peripheral circuit region is formed by a conventional method, and ion-implantation with low density is carried out in the peripheral circuit region.

Figure 7I:
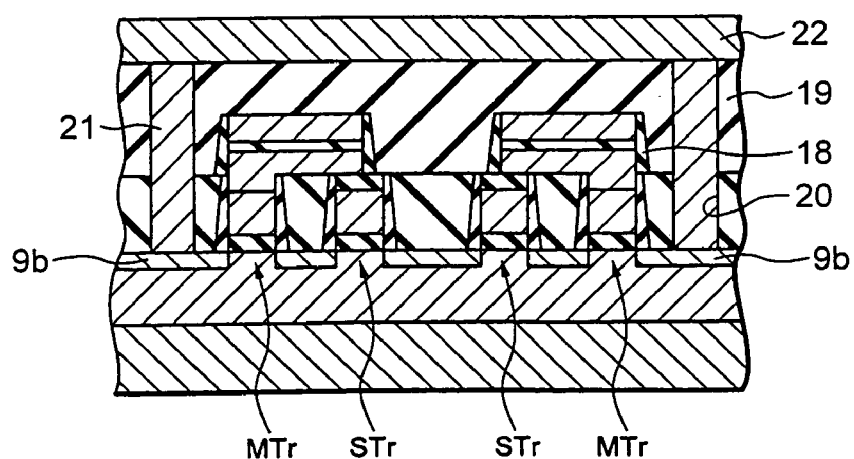
Figure 8E:
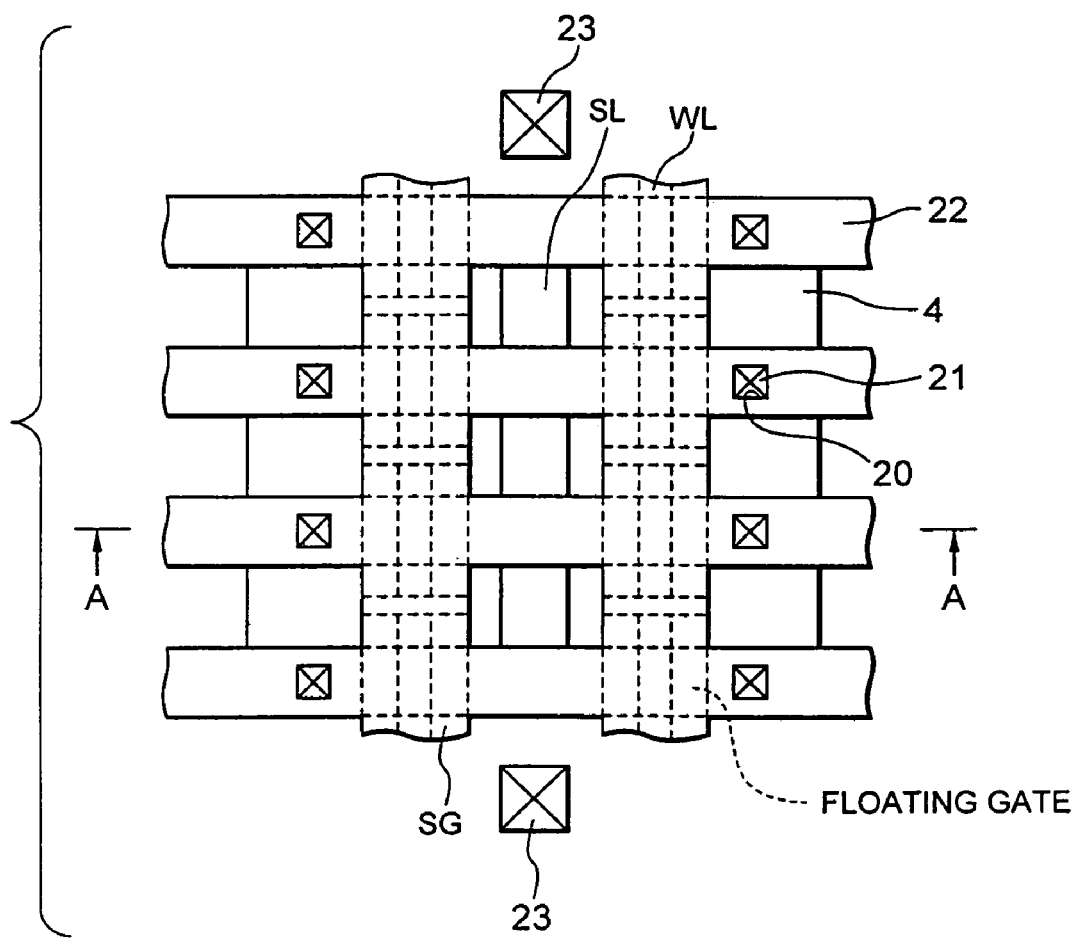

Then, a silicon oxide film is fully stacked, and the stacked film is etched back, whereby a side wall (not shown) is formed laterally of the gate electrode in the peripheral circuit region. At the same time, as shown in FIG. 7I, a side wall 18 composing of an oxide film is formed laterally of the polysilicon film 16, ONO film 15, and polysilicon film 13. Further, in the peripheral circuit region, the side wall is defined as a mask, and ion-implantation with high density is carried out, thereby forming a transistor with an LDD structure. Further, an interlayer insulation film 19 consisting of a BPSG (boron-doped phosphor-silicate glass) film, for example, is stacked by a CVD method. The thickness of the interlayer insulation film 19 is about 8000 to 10000 Angstroms, for example. Next, as shown in FIG. 8E, contact holes 20 reaching the N$^+$ diffusions 9b are formed in the interlayer insulation film 19 and silicon oxide film 11, wiring layers 21 are embedded in the contact holes 20, and a wiring layer 22 commonly connecting the wiring layers is further formed as a bit line BL. The wiring layers 21 and 22 are made of an aluminum alloy, for example, and the thickness of the wiring layer 22 is about 4000 to 6000 Angstroms, for example. As a source, a source line is formed commonly by the N$^+$ diffusion layer 9a. In addition, the N$^+$ diffusion layer 9b and wiring layer 21 are shared between the adjacent memory cell transistors in the columnar direction (transverse direction in FIG. 7I).

In addition, contact holes (not shown) are opened reaching the N$^+$ diffusion layer 9a that is a source by several bits at the same time when the contact hole 20 is formed, and the contact holes are embedded by the wiring layer 21. A stay of the wiring layer 22 is provided, and further, an interlayer insulation film is fully formed. Then, a contact hole 23 is formed so as to reach the stay of the wiring layer 22 formed in a source region prior to this interlayer insulation film, is embedded by a wiring layer (not shown), and is commonly connected in a wiring layer, thereby making it possible to make a resistance of a common source line lower than that in a case of only an N$^+$ diffusion layer.

Then, the full surface is coated with a passivation film such as PSG.

In the thus manufactured non-volatile semiconductor apparatus, a superimposed width between the floating gate and the control gate in the memory cell transistor MTr is significantly larger than the channel width, and thus, a larger capacity ratio can be ensured. Therefore, even if an operating voltage is reduced, the semiconductor apparatus can be well operated. In addition, each polysilicon film is patterned by self-alignment, and thus, the non-uniformity in characteristics caused by pattern shift or the like does not occur. Further, there does not exist the step of damaging the substrate 1, well 3 or the like, and thus, a conventional malfunction caused by generation of a leak current can be prevented.

Figure 10A:
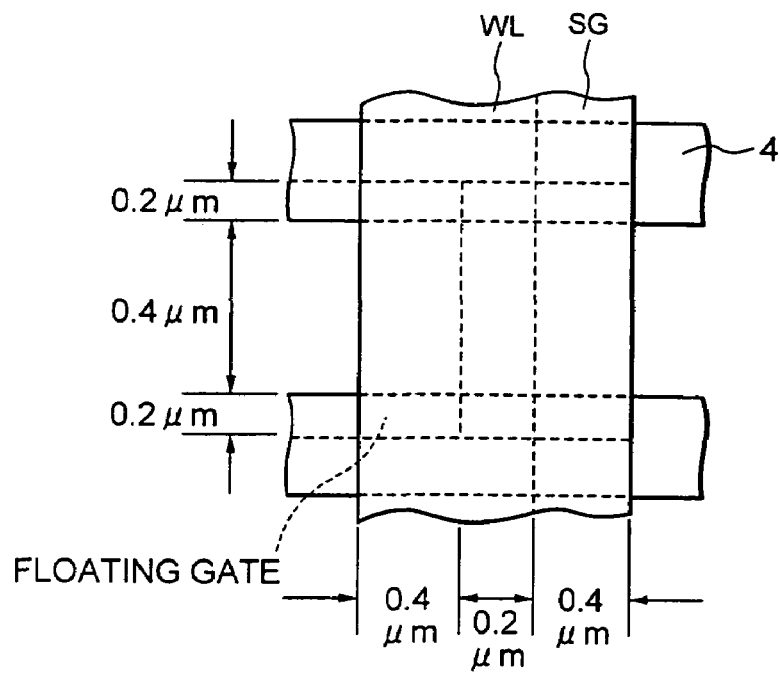
FIG. 10A is a layout showing a superimposition between a control gate and a floating gate in the non-volatile semiconductor storage apparatus manufactured according to the first embodiment.
Figure 10B:
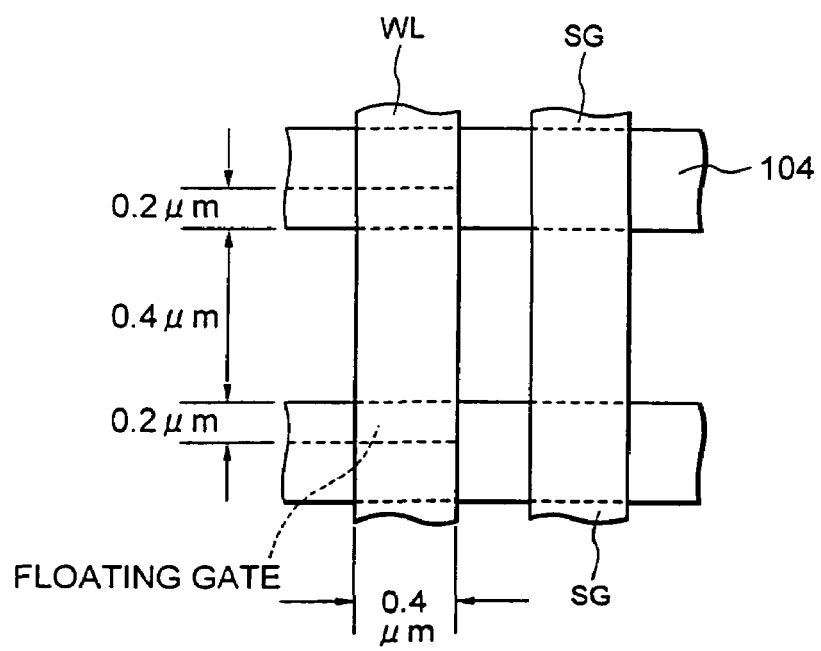
FIG. 10B is a layout showing a superimposition between the control gate and the floating gate in the non-volatile semiconductor storage apparatus manufactured according to the conventional method shown in FIG. 1A to FIG. 1C and FIG. 2.

FIG. 10A is a layout showing superimposition between the control gate and the floating gate in the non-volatile semiconductor storage apparatus according to the first embodiment. FIG. 10B is a layout showing superimposition between the control gate and the floating gate in the non-volatile semiconductor storage apparatus manufactured according to the conventional method shown in FIG. 1A to FIG. 1C and FIG. 2. When an interval of field insulation film is 0.4 micron; a superimposed width between the floating gate and the field insulation film is 0.2 micron; a width between the floating gate and the select gate is 0.4 microns; and an interval between the floating gate and the select gate is 0.2 micron, a width of the control gate (word line) in the first embodiment is 1.0 micron, and the width in the conventional method is 0.4 micron. Therefore, according to the first embodiment, a superimposed area between the floating gate and the control gate is 0.8 $\mu m^2$ as expressed by formula 1 below, and however, the area according to the conventional method is merely about 0.32 $\mu m^2$ as expressed by formula 2 below. Namely, according to the first embodiment, the superimposed area can be increased to 2.5 times.

(0.4+0.2+0.4)×(0.2+0.2+0.4)=0.80     [Formula 1]

0.4×(0.2+0.2+0.4)=0.32     [Formula 2]

Further, in the case where data is written by FN tunneling (channel implantation), and data is erased by FN tunneling (channel removal), the operating voltage shown in Table 1 is required in a non-voltage semiconductor storage apparatus manufactured according to the conventional method. However, in the non-volatile semiconductor storage apparatus manufactured according to the first embodiment, the operating voltage shown in Table 2 is sufficient.

TABLE 1

|  | Vd | Vcg | Vsg | Vs |
|---|---|---|---|---|
| Writing | 0 (V) | 20 (V) | −1 (V) | 0 (V) |
| Erasing | OPEN | −20 (V) | 1 (V) | 0 (V) |
| Readout | 1 (V) | 0 (V) | 2 (V) | GND |

TABLE 2

|  | Vd | Vcg | Vsg | Vs |
|---|---|---|---|---|
| Writing | 0 (V) | 14 (V) | −1 (V) | 0 (V) |
| Erasing | OPEN | −14 (V) | 1 (V) | 0 (V) |
| Readout | 1 (V) | 0 (V) | 2 (V) | GND |

In addition, in the case where data is written by channel hot electron (CHE), and data is erase by FN tunneling (source removal), the operating voltage shown in Table 3 is required in the non-volatile semiconductor storage apparatus manufactured by the conventional method. However, the operating voltage shown in Table 4 is sufficient in the non-voltage semiconductor storage apparatus manufactured according to the first embodiment.

TABLE 3

|  | Vd | Vcg | Vsg | Vs |
|---|---|---|---|---|
| Writing | 5 (V) | 16 (V) | 2 (V) | 0 (V) |
| Erasing | OPEN | −15 (V) | 0 (V) | 5 (V) |
| Readout | 1 (V) | 0 (V) | 2 (V) | GND |

TABLE 4

|  | Vd | Vcg | Vsg | Vs |
|---|---|---|---|---|
| Writing | 5 (V) | 10 (V) | 2 (V) | 0 (V) |
| Erasing | OPEN | −9 (V) | 0 (V) | 5 (V) |
| Readout | 1 (V) | 0 (V) | 2 (V) | GND |

In this way, the operating voltage can be reduced even if any system is employed.

Now, a second embodiment of the present application will be described. FIG. 11A to FIG. 11L are sectional views each showing a method of manufacturing a non-voltage semiconductor storage apparatus according to the second embodiment of the present invention in order of steps. In addition, FIG. 12A to FIG. 12E are layouts each showing a method of manufacturing a non-voltage semiconductor storage apparatus according to the second embodiment of the present invention in order of steps. FIG. 11A to FIG. 11L are sectional views, each of which indicates a position taken along line B—B shown in FIG. 12A to FIG. 12E.

Figure 11A:
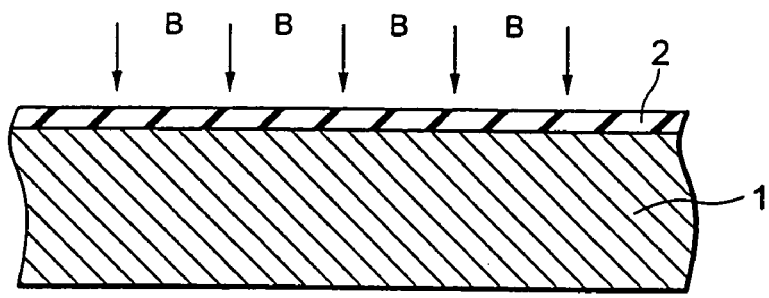
FIG. 11A to FIG. 11L are sectional views each showing a method of manufacturing a non-volatile semiconductor storage apparatus according to a second embodiment of the present invention in order of steps.

In the second embodiment, as shown in FIG. 11A, a silicon oxide film 2 is first formed on the surface of a P-type silicon substrate 1. Next, boron (B) is ion-implanted into the P-type silicon substrate 1 at the implantation energy of about 100 keV and at the dosage of about $10^{13}$ atoms/cm$^2$, for example. Subsequently, heat treatment is carried out at a temperature of about 1000° C.

Figure 11B:
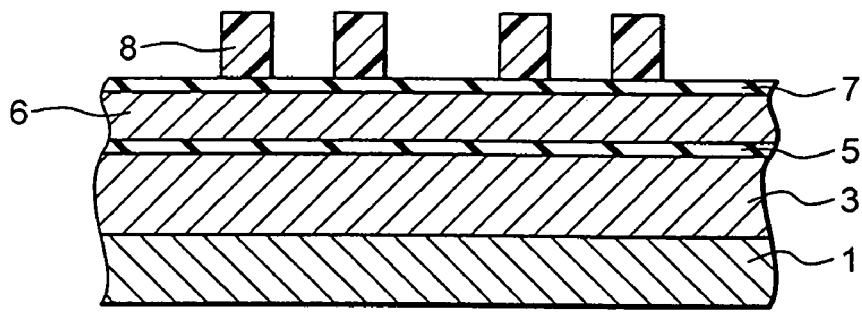
Figure 12A:
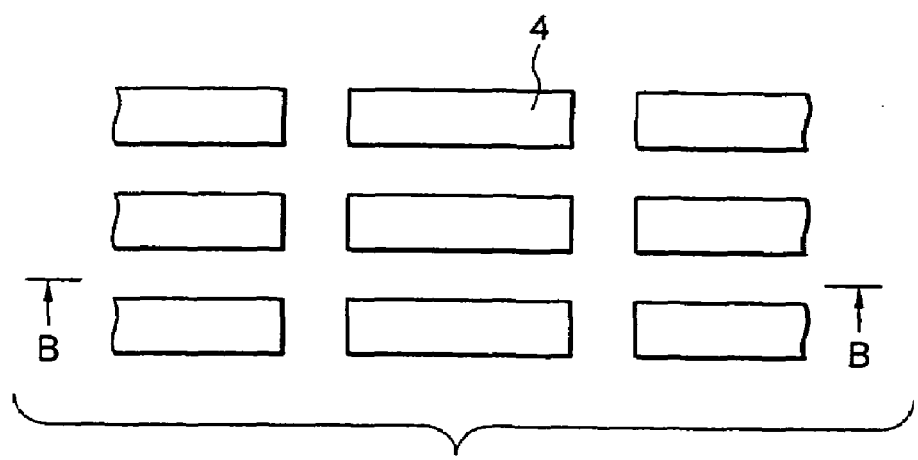
FIG. 12A to FIG. 12E are layouts each showing a method of manufacturing a non-volatile semiconductor storage apparatus according to a second embodiment of the present invention in order of steps.

As a result, as shown in FIG. 11B, a P well 3 is formed under the silicon oxide film 2. A memory cell array is to be formed in this P well 3. Next, a plurality of field insulation films 4 for element separation are formed at the surface of the P-type silicon substrate 1 so as to be orthogonal to the word line WL. At this time, the field insulation films 4 may be regularly disposed vertically and horizontally, for example, as shown in FIG. 12A. These films may be regularly disposed in a linear shape that extends in a transverse direction. In addition, the thickness of the field insulation film 4 is about 4000 to 8000 Angstroms, for example.

Next, as shown in FIG. 11B, the surface of the P-type silicon substrate 1 is thermally oxidized at about 800 to 900° C., whereby a tunnel gate oxide film 5 of about 100 Angstroms in thickness is formed in a region that is to be an active region. Further, a polysilicon film 6 is stacked on the tunnel gate oxide film 5 by the low pressure CVD method. The film thickness of the polysilicon film 6 is about 1000 to 2000 Angstroms, for example. This film is obtained as a portion of the floating gate of the memory cell transistor MTr and a gate of the select transistor Str in accordance with the subsequent steps. Next, phosphor is doped in the polysilicon film 6, for example, thereby reducing the resistance of the polysilicon film 6. Then, a silicon nitride film 7 is stacked on the polysilicon film 6 by the low pressure CVD method. The thickness of the silicon nitride film 7 is about 1000 to 2000 Angstroms, for example. Sequentially, a photo-resist film 8 is formed on the silicon nitride film 7, and the photo-resist film 8 is patterned by lithography technique so as to remain in a predetermined region in which a gate electrode is to be formed. At this time, four predetermined regions in which the gate electrodes are formed exist per one field insulation film 4, and the external two regions are obtained as a select transistor STr, and the inner two regions are obtained as a memory cell transistor MTr.

Figure 11C:
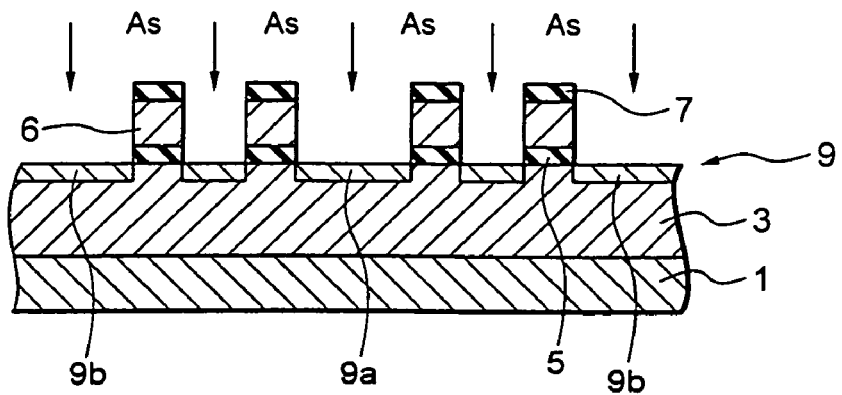
Figure 11D:
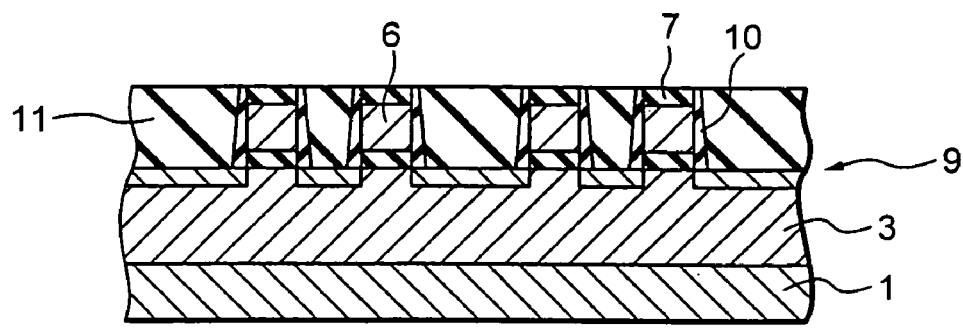
Figure 12B:
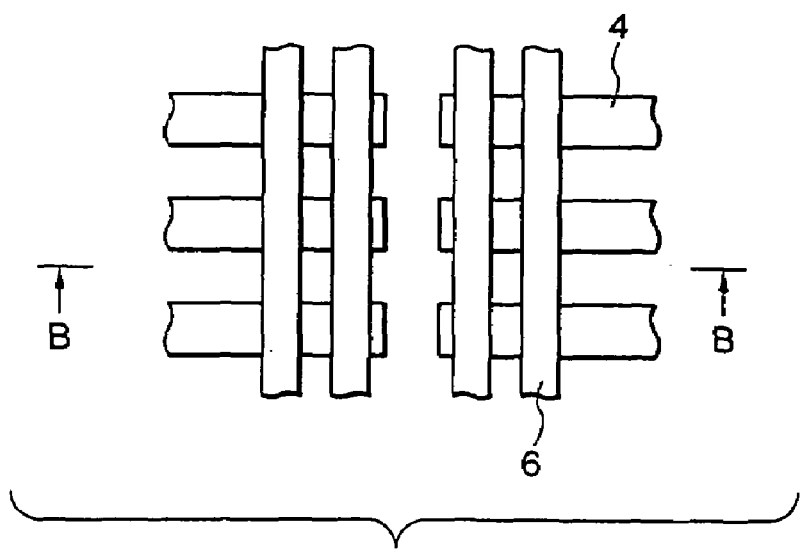

As shown in FIG. 11C and FIG. 12B, the photo-resist film 8 is defined as a mask, and the silicon nitride film 7, polysilicon film 6, and tunnel gate oxide film 5 are sequentially etched in a direction vertical to the field insulation film 4. Further, N-type impurities, for example, arsenic (As) is ion-implanted at the implantation energy of 50 keV and at the dosage of about $10^{15}$ atoms/cm$^2$, whereby an N$^+$ diffusion layer 9 is formed as an active region. Of the N$^+$ diffusion layer 9 in FIG. 11C, an N$^+$ diffusion layer 9a is obtained as a source diffusion layer, and an N$^+$ diffusion layer 9b is obtained as a drain diffusion layer.

Next, a silicon nitride film is fully stacked with the thickness of about 1000 to 2000 Angstroms, for example, and anisotropic etching is applied to the silicon nitride film, thereby forming a side wall 10 that consists of a nitride film laterally of the residual polysilicon film 6 or the like as shown in FIG. 1D. Further, the silicon oxide film 11 is fully stacked with the thickness of about 3000 to 5000 Angstroms, for example, and the stacked film is removed by etching using the CMP technique until the silicon nitride film 7 on the polysilicon film 6 has exposed. During previous arsenic ion-implantation shown in FIG. 11C, the implantation energy may be set as 40 keV, and the dosage may be set as $10^{13}$ atoms/cm$^2$, and when the side wall 10 is formed, arsenic may be ion-implanted at the implantation energy of 50 keV and at the dosage of $10^{15}$ atoms/cm$^2$, whereby a source and a drain may be LDD structure.

Figure 11E:
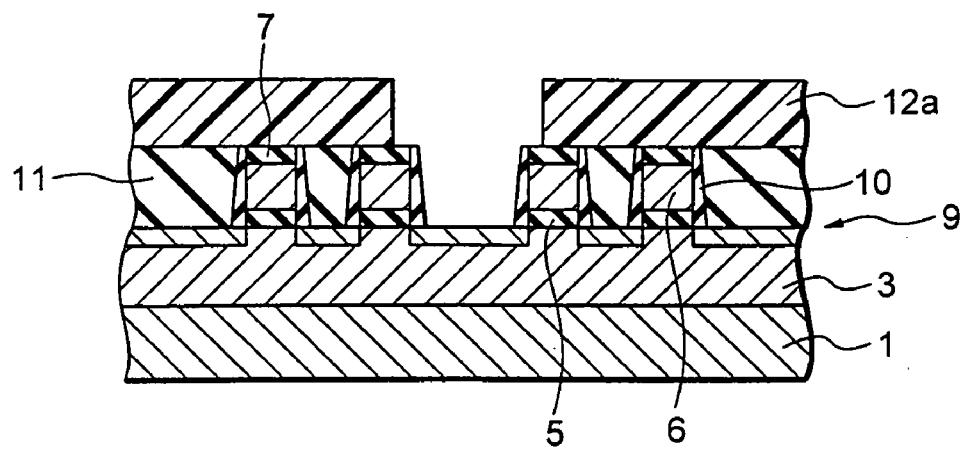

Next, as shown in FIG. 11E, a photo-resist film 12a is fully formed, and the photo-resist film 12a on the N$^+$ diffusion layer 9a is patterned by lithography technique. The photo-resist film 12a is defined as a mask, and the exposed silicon oxide film 11 is removed by means of etching.

Figure 11F:
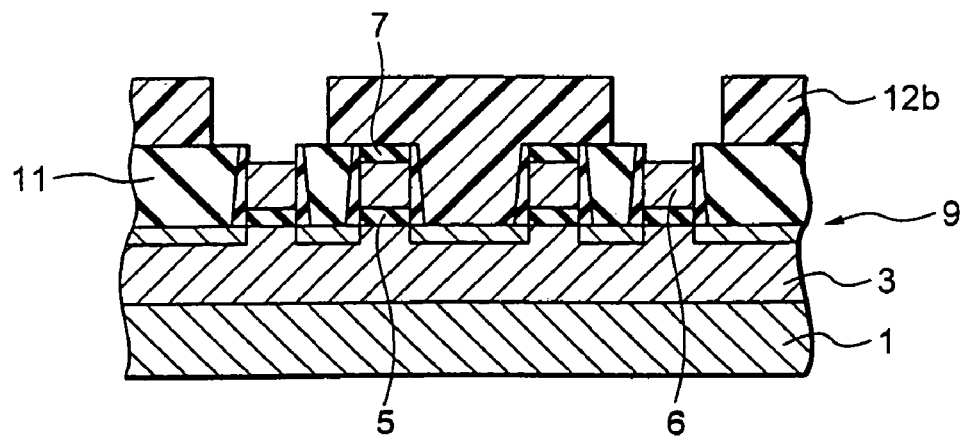

Then, as shown in FIG. 11F, a photo-resist film 12b is fully formed, and the photo-resist film 12b in a predetermined region in which the memory cell transistor MTr is patterned by lithography technique. Then, the photo-resist film 12b is defined as a mask, and the exposed silicon nitride film 7 is removed by means of etching.

Figure 11G:
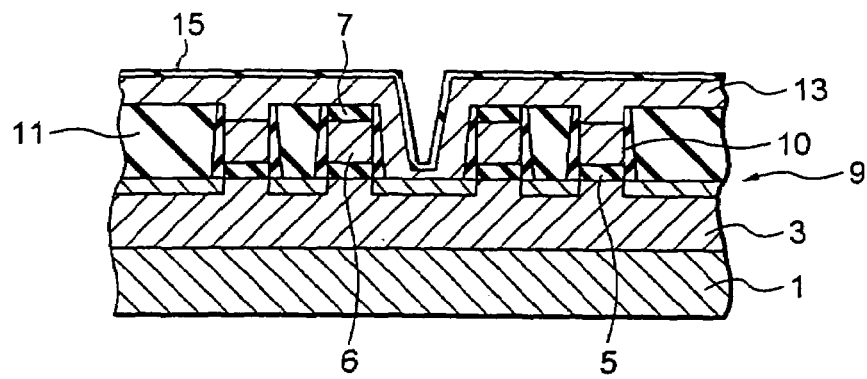

Next, as shown in FIG. 11G, the photo-resist film 12b is removed, and a polysilicon film 13 is fully stacked by the low pressure CVD method. The film thickness of the poly silicon film 13 is about 1000 to 2000 Angstroms, for example. Then, phosphor is doped in the polysilicon film 13 by thermal diffusion, ion-implantation technique or the like, for example, thereby reducing the resistance of the polysilicon film 13.

Figure 12C:
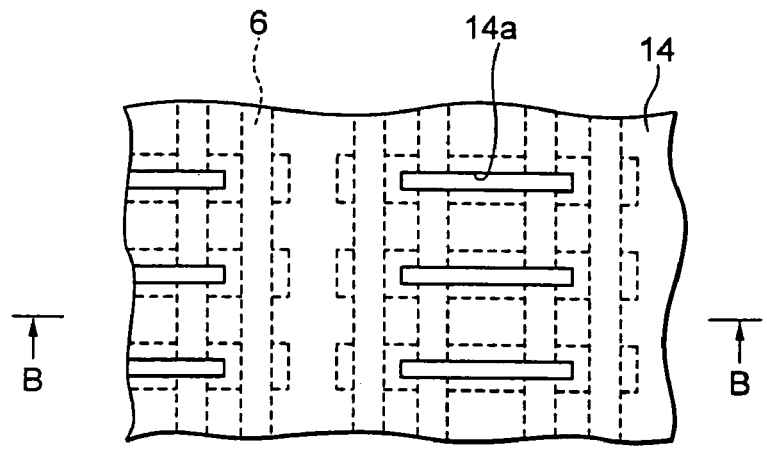

Subsequently, as shown in FIG. 12C, a photo-resist film 14 is formed on the polysilicon film 13, and the formed photo-resist film 14 is patterned by lithographic technique in the shape in which a slit shaped opening 14a crossing internal two polysilicon films 6 is provided per one field insulation film 4 in planar view. Then, the photo-resist film 14 is defined as a mask, and the polysilicon films 6 and 13 on the field insulation film 4 are removed in a slit shape by means of etching.

Next, as shown in FIG. 11G, a first HTO film, silicon nitride film and second HTO film are fully stacked sequentially, thereby forming an ONO film 15. This ONO film 15 is obtained as an insulation film between the floating gate and the control gate in the memory cell transistor MTr. The first HTO film may be formed with the thickness of about 60 Angstroms, for example, by means of a high-temperature low pressure CVD method. The silicon nitride film may be formed with the thickness of about 80 Angstroms by means of the low pressure CVD method. The second HTO film may be formed with the thickness of about 100 Angstroms, for example, by using high temperature low pressure CVD method.

Figure 11H:
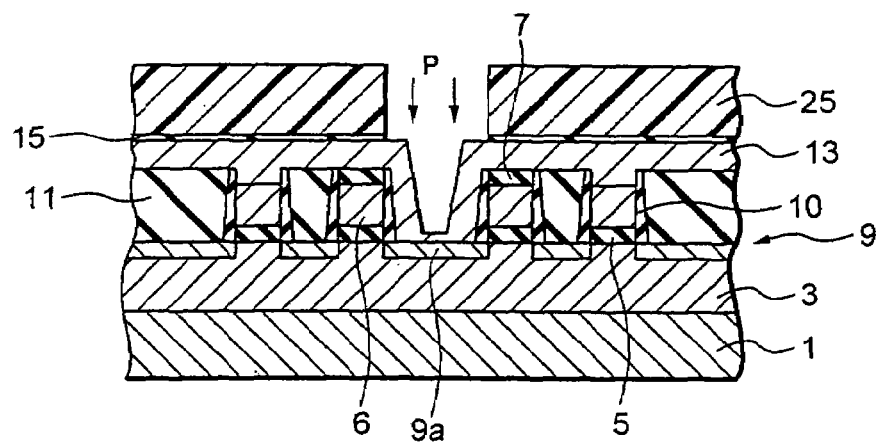

Next, as shown in FIG. 11H, a photo-resist film 25 shaped in the same as the photo-resist film 12a is formed on the ONO film 15, the photo-resist film 25 is defined as a mask, and the ONO film 15 on the N$^+$ diffusion film 9a is removed by means of etching. Further, the photo-resist film 25 is defined as a mask, phosphor is doped again by means of thermal diffusion, ion-implantation technique or the like, thereby reducing the resistant of the polysilicon film 13 more significantly. At this time, the implantation energy is 40 keV, for example, and the dosage is $10^{14}$ atoms/cm$^2$, for example. The polysilicon film 13 at the portion is obtained a common source contact.

Figure 11I:
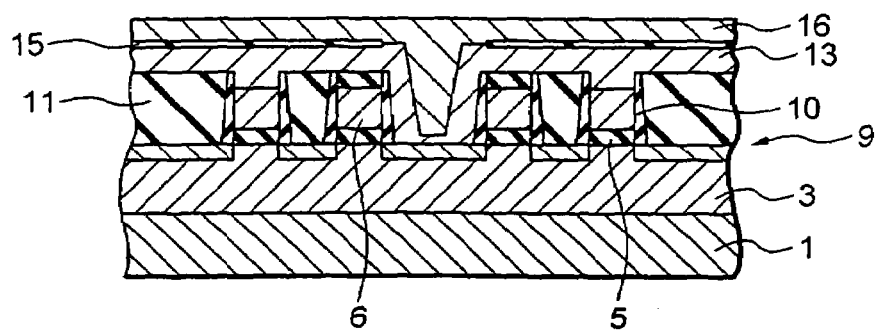

Further, as shown in FIG. 11I, a polysilicon film 16 is fully stacked by means of the low pressure CVD method. The thickness of the polysilicon film 16 is about 1000 to 2000 Angstroms, for example. Next, phosphor is doped in the polysilicon film 16 by thermal diffusion, ion-implantation technique or the like, for example, thereby reducing the resistance of the polysilicon film 16. Thereafter, a tungsten silicide (Wsi) film may be formed, whereby a gate may be polycide structured.

Figure 11J:
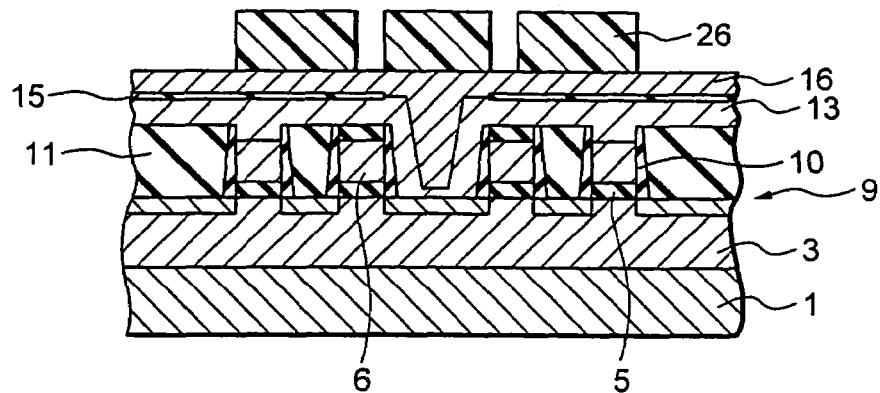

Next, as shown in FIG. 11J, a photo-resist film 26 is formed on the polysilicon film 16, and this photo-resist film 26 is further patterned to remain from a portion above the memory cell transistor MTr to the select transistor STr and cover the polysilicon film 16 on the N$^+$ diffusion layer 9a.

Figure 11K:
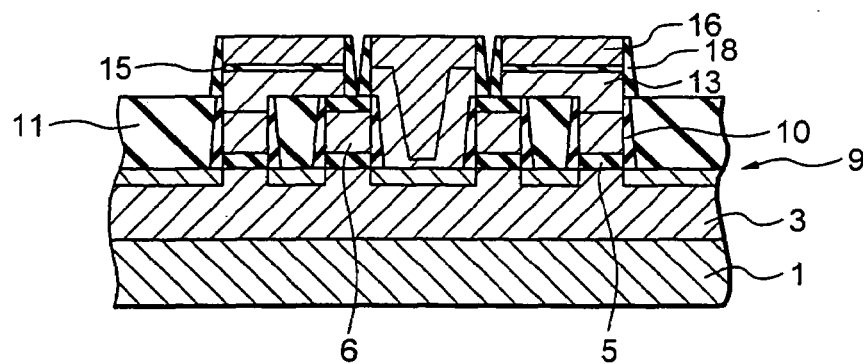
Figure 12D:
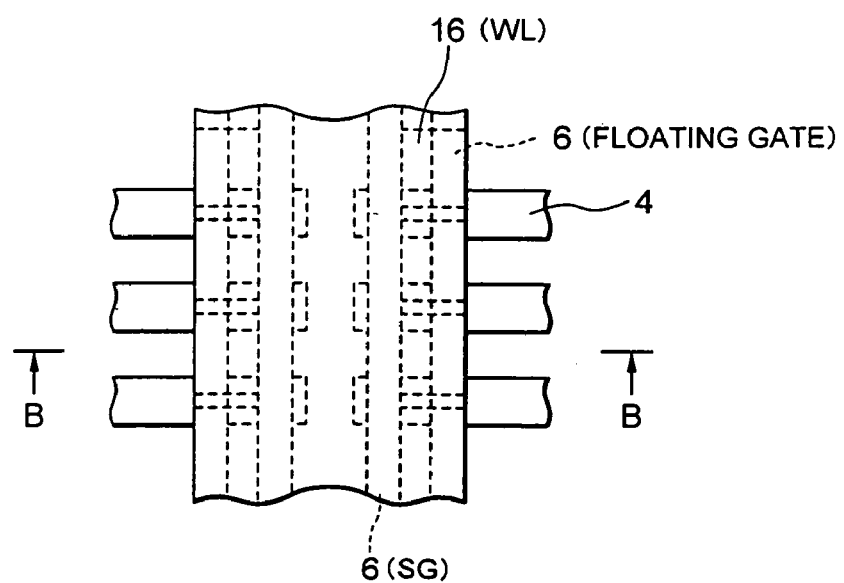

Then, as shown in FIG. 11K and FIG. 12D, the photo-resist film 26 is defined as a mask, and the polysilicon film 16, ONO film 15, and silicon film 13 are sequentially removed by means of etching. The floating gate and control gate of the memory cell transistor MTr are superimposed on each other in a region enclosed in dotted line in FIG. 12D.

Here, a gate electrode (not shown) of a transistor that configures a logical circuit is formed in a peripheral circuit configuration by means of a general method, and ion-implantation with low density is carried out in the peripheral circuit region.

Thereafter, a silicon oxide film is fully stacked, and the stacked silicon oxide film is etched back, whereby a side wall (not shown) is formed laterally of the gate electrode in the peripheral circuit region. At the same time, as shown in FIG. 11K, a side wall 18 consisting of an oxide film is formed laterally of the polysilicon film 16, ONO film 15, and polysilicon film 13. Further, in the peripheral circuit region, a side wall is defined as a mask, and ion-implantation with high density is carried out, thereby forming a transistor with an LDD structure.

Figure 11L:
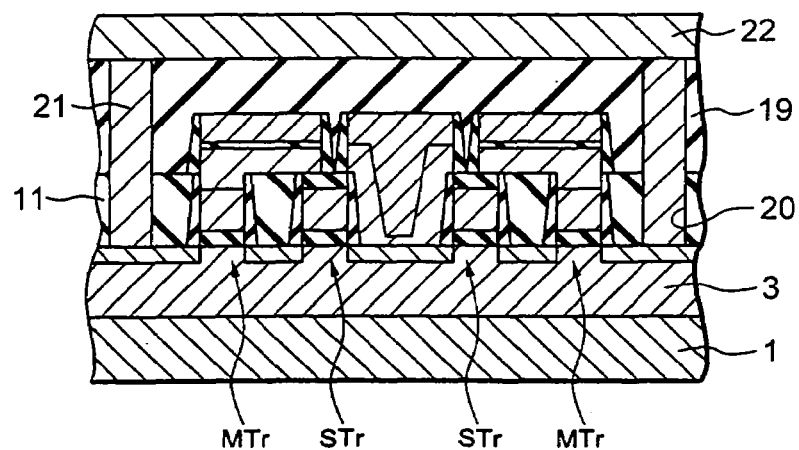
Figure 12E:
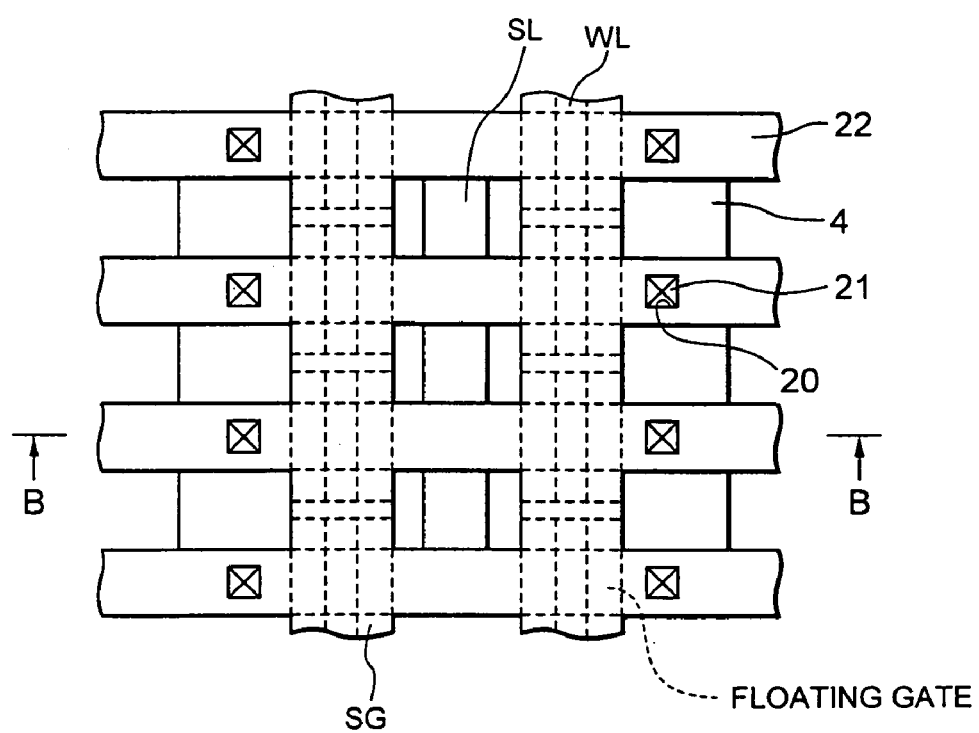

Further, as shown in FIG. 11L, an interlayer insulation film 19 consisting of a BPSG film, for example, is fully stacked by the CVD method. The thickness of the interlayer insulation film 19 is about 8000 to 10000 Angstroms, for example. Next, as shown in FIG. 12E, contact holes 20 reaching the $N^+$ diffusion layers 9b are formed in the interlayer insulation film 19 and silicon oxide film 11, and wiring layers 21 are embedded in the contact holes 20, and a wiring layer 22 commonly connecting the wiring layers 21 in a transverse direction is further formed as a bit line BL. The wiring layers 21 and 22 are made of an aluminum alloy, for example, and the thickness of the wiring layer 22 is about 4000 to 6000 Angstroms, for example. As a source, a source line is commonly formed by the $N^+$ diffusion layer 9. In addition, the $N^+$ diffusion layer 9b and wiring layer 21 are shared between the adjacent memory cell transistors in a columnar direction (transverse direction in FIG. 11L).

In addition, contact holes (not shown) are also opened reaching the $N^+$ diffusion layer 9a, which is a source by several bits at the same time as when the contact hole 20 is formed, and is embedded with the wiring layer 21. A stay of the wiring layer 22 is provided, and further, an interlayer insulation film is fully formed. A contact hole 23 is formed so as to reach the stay of the wiring layer 22 formed on the previous source region in this interlayer insulation film, is embedded in a wiring layer (not shown), and is commonly connected in a wiring layer, thereby making it possible to reduce the resistance of a common source line more significantly than when the film is formed of only an $N^+$ diffusion layer.

Then, the full surface is covered with a passivation film such as PSG.

According to the second embodiment, in addition to an advantageous effect according to the first embodiment, a source contact of the select transistor STr is formed at the same time when a portion of the floating gate and control gate of the memory cell transistor MTr are formed. Thus, there can be provided an advantageous effect that the number of steps can be reduced.

Now, a third embodiment of the present invention will be described here. FIG. 13A to FIG. 13I are sectional views each showing a method of manufacturing a non-volatile semiconductor storage apparatus according to the third embodiment of the present invention in order of steps. In addition, FIG. 14A to FIG. 14E are layouts each showing a method of manufacturing a non-volatile semiconductor storage apparatus in order of steps. FIG. 13A to FIG. 13I are sectional views, each of which indicates a position taken along line C—C in FIG. 14A to FIG. 14E.

In the third embodiment, a silicon oxide film 2 is first formed on the surface of a P-type silicon substrate 1. Next, boron is ion-implanted in the P-type silicon substrate 1, for example, at the implantation energy of about 100 keV and at the dosage of $10^{13}$ atoms/cm$^2$. Sequentially, thermal treatment is carried out at a temperature of about 1000° C.

Figure 13A:
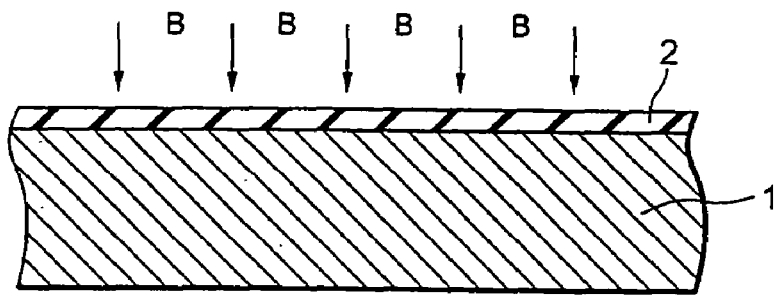
FIG. 13A to FIG. 13I are sectional views each showing a method of manufacturing a non-volatile semiconductor storage apparatus according to a third embodiment of the present invention in order of steps.
Figure 13B:
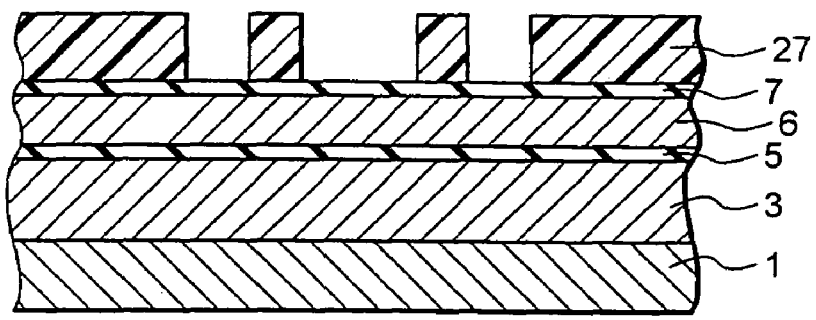
Figure 14A:
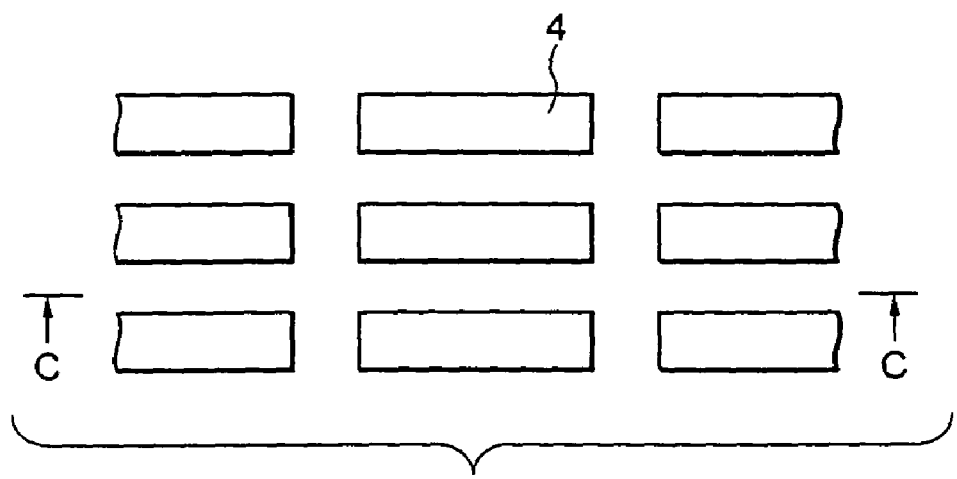
FIG. 14A to FIG. 14E are layouts each showing a method of manufacturing a non-volatile semiconductor storage apparatus according to a third embodiment of the present invention in order of steps.

As a result, as shown in FIG. 13B, a P well 3 is formed under the silicon oxide film 2. A memory cell array is to be formed in this P well 3. Next, a plurality of field insulation films 4 for element separation are formed on the surface of the P type silicon substrate 1 so as to be orthogonal to the word line WL. At this time, the field insulation film 4 may be regularly disposed longitudinally and vertically, for example, as shown in FIG. 14A, and may be regularly disposed in a linear shape that extends in a transverse direction, as shown in FIG. 9A. In addition, the thickness of the field insulation film 4 is about 4000 to 8000 Angstroms, for example. Further, the surface of the P type silicon substrate 1 is thermally oxidized at about 800 to 900 ° C., for example, whereby forming a tunnel gate oxide film 5 of about 100 Angstroms in a region that is to be an active region. Next, a polysilicon film 6 is stacked on the tunnel gate oxide film 5 by the low pressure CVD method. The film thickness of the polysilicon film 6 is about 1000 to 2000 Angstroms, for example, and a portion of the floating gate of the select transistor STr and a gate of the memory cell transistor Tr are obtained by the subsequent steps. Next, phosphor is doped in the polysilicon film 6 by thermal diffusion, ion-implantation technique or the like, whereby reducing the resistance of the polysilicon film 6. Then, a silicon nitride film 7 is stacked on the polysilicon film 6 by the low pressure CVD method. The thickness of the silicon nitride film 7 is about 1000 to 2000 Angstroms, for example. Subsequently, a photo-resist film 27 is formed on the silicon nitride film 7, and the photo-resist film 27 is patterned by lithography technique in the shape that openings are provided at both sides of the polysilicon film 7 that is to be the gate of the memory cell transistor MTr. The width of an opening positioned between two memory cell transistors is wider than that of an opening positioned between the memory cell transistor MTr and the select transistor STr to an extent such that a space between the polysilicon films 6 is not embedded by a side wall formed during the subsequent steps. On the other hand, the width of the opening positioned between the memory cell transistor MTr and the select transistor STr is to an extent such that a space between the polysilicon films 6 is embedded by a side wall formed during the subsequent steps.

Figure 13C:
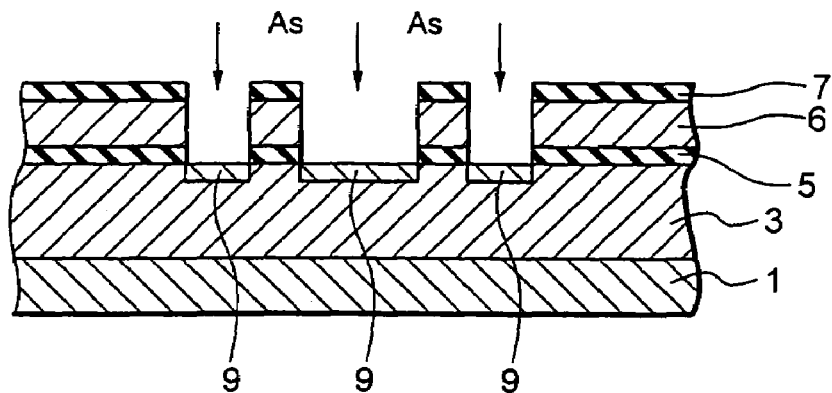
Figure 14B:
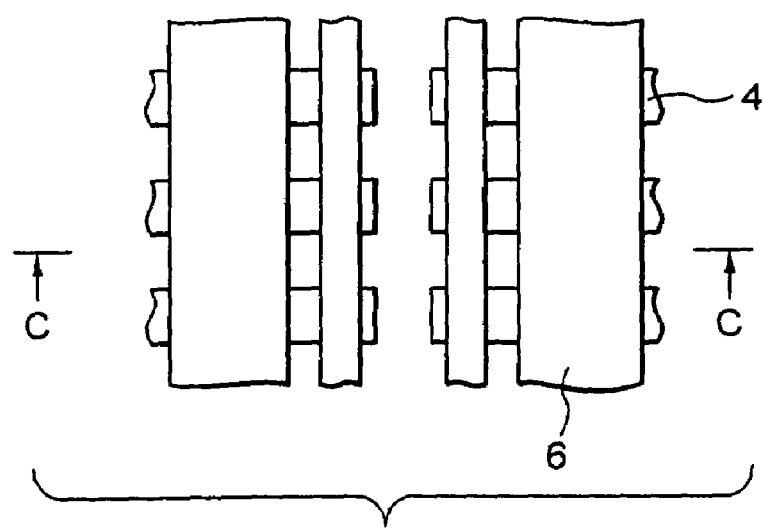

As shown in FIG. 13C and 14B, the photo-resist film 27 is defined as a mask, and the silicon nitride film 7, polysilicon film 6, and tunnel gate oxide film 5 are sequentially etched in a direction vertical to the field insulation film 4. Next, after the photo-resist film 27 has been removed, ion-implantation of arsenic (As) is carried out, thereby forming an $N^+$ diffusion layer 9. Among them, a center $N^+$ diffusion layer 9 is obtained as a source diffusion layer. The energy of As ion-implantation is 50 keV, for example, and the dosage is $10^{15}$ atoms/cm$^2$, for example.

Figure 13D:
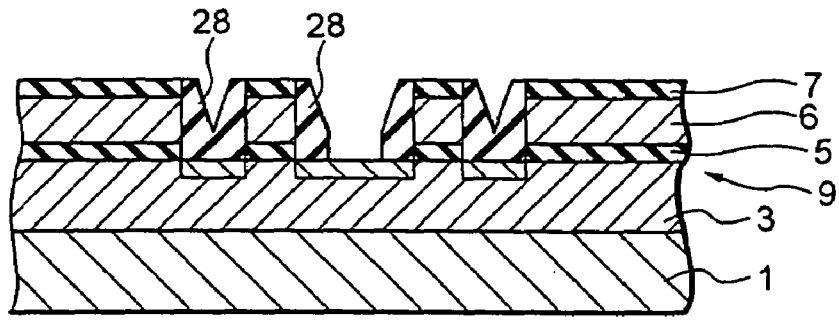

Subsequently, a silicon nitride film is fully stacked, and the silicon nitride film is subjected to anisotropic etching, whereby a side wall 28 is formed laterally of the polysilicon film 6 or the like, as shown in FIG. 13D. At this time, although a center groove is not embedded by the side wall 28, the grooves on both sides are embedded by the side wall 28. As the first embodiment, to make the side wall 28, a silicon oxide film may be fully stacked and flattened by CMP technique, whereby only a source contact portion may be removed by etching the silicon oxide film.

Figure 13E:
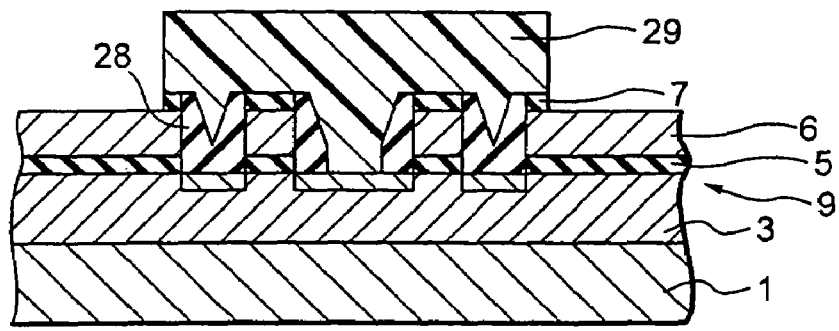

Next, as shown in FIG. 13E, a photo-resist film 29 is formed, and the photo-resist film 29 is patterned so as to remain between drains of two select transistors STr in which a source is to be commonly connected. Namely, a region to be the gate or drain of the memory cell transistor MTr of the photo-resist film 29 is removed. Then, the photo-resist film 29 is defined as a mask, and the silicon nitride film 7 is removed by means of etching.

Figure 13F:
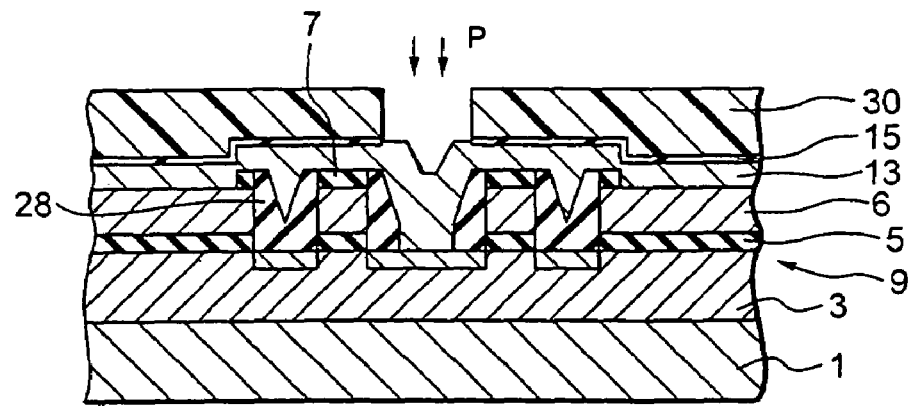

Subsequently, the photo-resist film 29 is removed, and a polysilicon film 13 is fully stacked by the low pressure CVD method, as shown in FIG. 13F. The film thickness of the polysilicon film 13 is about 1000 to 2000 Angstroms, for example. Next, phosphor is doped in the polysilicon film 13 by thermal diffusion, ion-implantation technique or the like, thereby reducing the resistance of the polysilicon 13.

Figure 14C:
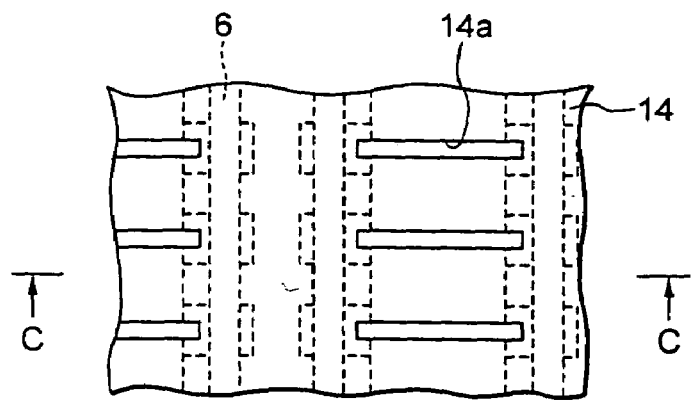

Subsequently, as shown in FIG. 14C, a photo-resist film 14 is formed on the polysilicon film 13, and the photo-resist film 14 is patterned by lithography technique in the shape that a slit shaped opening 14*a* crossing the polysilicon film 6 with its wide inside is provided per one field insulation film 4 in a planar view. Then, the photo-resist film 14 is defined as a mask, and the polysilicon films 6 and 13 on the field insulation film 4 are removed in slit shape by means of etching.

Next, as shown in FIG. 13F, a first HTO film, silicon nitride film, and second HTO film are fully stacked sequentially, thereby forming an ONO film 15. This ONO film 15 is provided as an insulation film between the floating gate and the control gate in the memory cell transistor MTr. The first HTO film may be formed with the thickness of about 60 Angstroms, for example, by means of a high temperature low pressure CVD method. The silicon nitride film may be formed with the thickness of about 80 Angstroms, for example, by means of the low pressure CVD method. The second HTO film may be formed with the thickness of about 100 Angstroms, for example, by means of the high temperature low pressure CVD method.

Next, as shown in FIG. 13F, a photo-resist film 30 having an opening on a polysilicon film 13 in a source contact region is defined as a mask, and the ONO film 15 is removed by means of etching. Further, the photo-resist film 30 is defined as a mask, and phosphor is doped again in the polysilicon film 13 by the thermal diffusion, ion-implantation technique or the like, thereby reducing the resistance of the polysilicon film 13 more significantly. At this time, the implantation energy is 40 keV, for example, and the dosage is $10^{14}$ atoms/cm$^2$, for example.

Figure 13G:
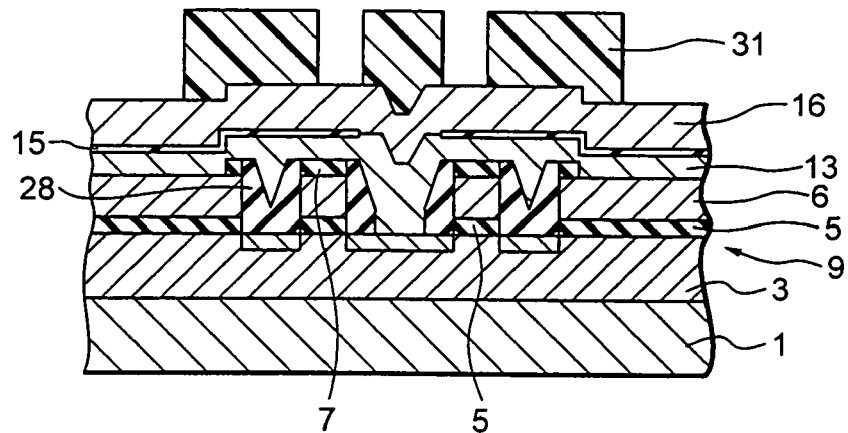
Figure 14D:
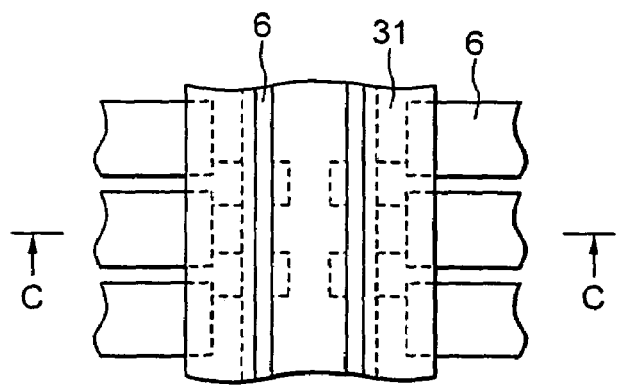

Sequentially, as shown is FIG. 13G and FIG. 14D, the polysilicon film 16 is fully stacked by low pressure CVD method. The thickness of the polysilicon film 16 is about 1000 to 2000 Angstroms, for example. Next, phosphor is doped in the polysilicon film 16 by the thermal diffusion, ion-implantation technique or the like, thereby reducing the resistance of the polysilicon film 16. Further, a photo-resist film 31 is formed on the polysilicon film 16, and this photo-resist film 31 is patterned to remain from a portion above the memory cell transistor MTr to the select transistor STr and cover the polysilicon film 16 in a region to be a source contact. A tungsten silicide (WSi) film may be formed after phosphor doping, whereby a gate may be polycide structured.

Figure 13H:
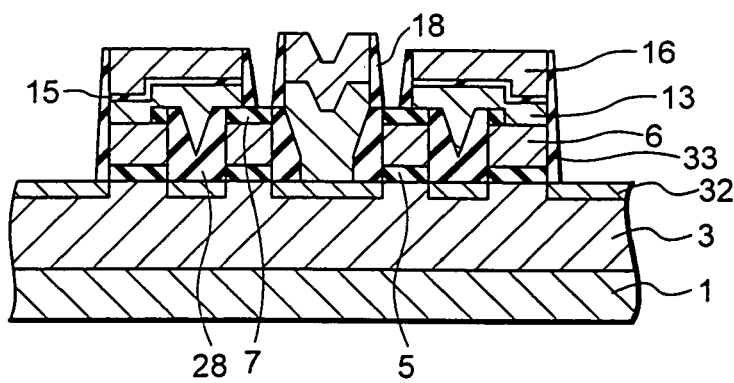
Figure 14E:
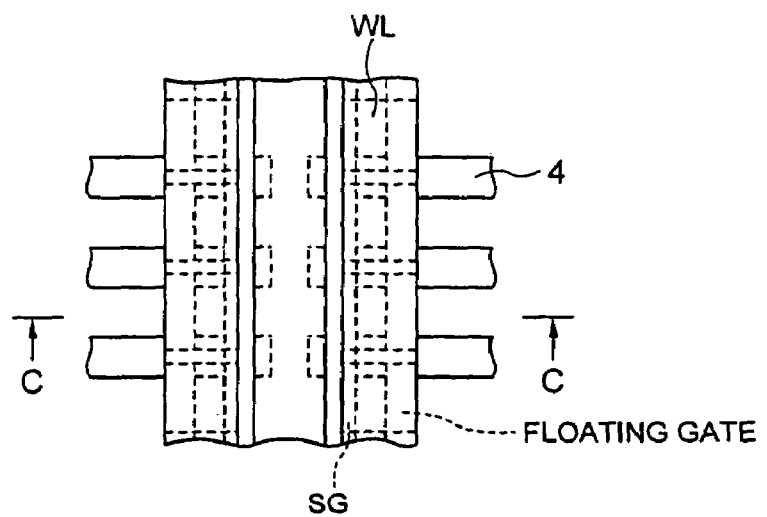

Then, as shown in FIG. 13H and FIG. 14E, the photo-resist film 31 is defined as a mask, and the polysilicon film 16, ONO film 15, and polysilicon film 13 are sequentially removed by means of etching. In FIG. 14E, the floating gate and control gate of the memory cell transistor MTr are superimposed on each other in a region encoded in dotted line.

Here, a gate electrode (not shown) of a transistor that configures a logical circuit in a peripheral circuit region is formed by a general method, and ion-implantation with low density is carried out in the peripheral circuit area. At the same time, as shown in FIG. 13H, an N type diffusion film 32 is formed in a drain of the memory cell transistor.

Then, a silicon oxide film is fully stacked, and the silicon oxide film is etched back, whereby a side wall (not shown) is formed laterally of a gate electrode in the peripheral circuit region. At the same time, as shown in FIG. 13H, there are formed side walls 18 and 33 that consist of oxide films laterally of the polysilicon film 16, ONO film 15, polysilicon film 13 and the polysilicon film 6. Further, in the peripheral circuit region, a side wall is defined as a mask, and ion-implantation with high density is carried out, thereby forming a transistor with LDD structure.

Figure 13I:
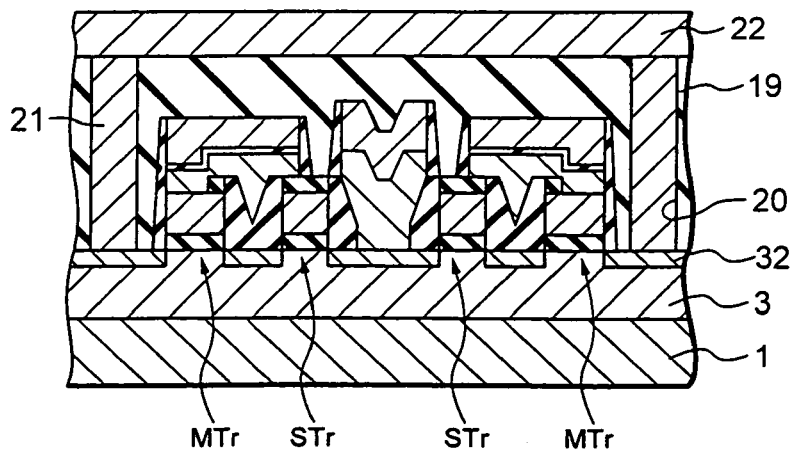

Further, as shown in FIG. 13I, an interlayer insulation film 19 consisting of a BPSG film, for example, is fully stacked by CVD method. The thickness of the interlayer insulation film 19 is about 8000 to 10000 Angstroms, for example. Next, contact holes 20 reaching N-type diffusion layers 32 are formed in the interlayer insulation film 19, wiring layers 21 are embedded in the contact holes 20, and further, a wiring layer 22 commonly connecting the wiring layers 21 in a transverse direction is formed as a bit line BL. The wiring layers 21 and 22 are made of an aluminum alloy, for example, and the thickness of the wiring layer 22 is about 4000 to 6000 Angstroms, for example.

Further, an interlayer insulation film is fully formed, and a contact hole (not shown) reaching the N$^+$ diffusion layer 9*a* is formed in the interlayer insulation layer 19, and silicon oxide film 11. At this contact hole 23, some filed insulation films 4 are formed by several bits with intervals. The wiring layer (not shown) is embedded in the contact hole, and further, a wiring layer (not shown) commonly connecting this wiring layer in a longitudinal direction is formed as a source line SL.

Thereafter, the full surface is covered with passivation such as PSG.

According to the third embodiment, as in the second embodiment, in addition to an advantageous effect caused by the first embodiment, the source contact of the select transistor STr is formed at the same time when a portion of the floating gate of the memory cell transistor MTr and the control gate are formed. Thus, there can be provided an advantageous effect that the number of steps can be reduced.

Figure 9B:
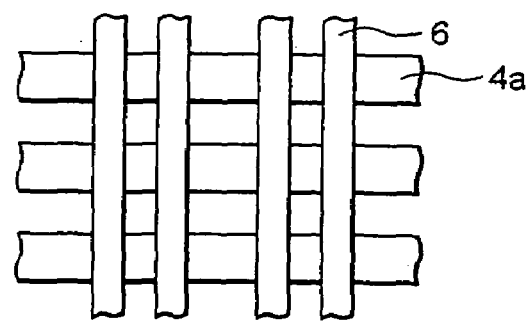
Figure 9C:
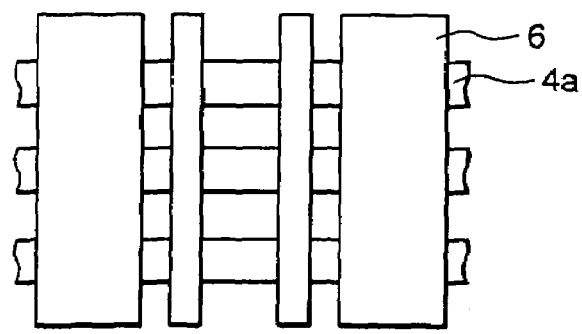

As shown in FIG. 9A, in the case where a linear field insulation film 4*a* is formed, a first polysilicon film may be patterned as shown in FIG. 9B in the first and second embodiments and as shown in FIG. 9C in the third embodiment.

What is claimed is:

1. A non-volatile semiconductor storage apparatus comprising:

a memory cell array which has unit cells arranged in a rectangular matrix shape, said unit cell including:

a memory cell field effect transistor having a floating gate and a control gate; and a select field effect transistor having a drain connected to a source of said memory cell field effect transistor, said floating gate and control gate extending to a position above a gate of said select field effect transistor, top and bottom surfaces of said floating gate and said control gate in said position being parallel to top and bottom surfaces of said gate of said select field effect transistor, an insulating layer formed directly below said floating gate and said gate of said select field effect transistor and forming a tunneling gate oxide layer in a region to be an active region of said unit cell.

2. A non-volatile semiconductor storage apparatus having a memory cell array having unit cells, said unit cell including a memory cell field effect transistor and a select field effect transistor, said memory cell field effect transistor having a floating gate and a control gate, and said select field effect transistor having a drain connected to a source of said memory cell field effect transistor, said storage apparatus comprising:
- a first semiconductor layer composing a portion of said floating gate and a gate of said select field effect transistor;
- a second semiconductor layer formed on said first semiconductor layer in said memory cell field effect transistor, said second semiconductor layer not contacting said tunneling gate oxide layer, a lower surface of said second semiconductor layer being located at a height at least equal to a height of an upper surface of said first semiconductor layer, said second semiconductor layer composing another portion of said floating gate and extending to a position above said gate of said select field effect transistor;
- a first insulation layer which insulates said first semiconductor layer from said second semiconductor layer on said select field effect transistor, said first insulation layer contacting said first semiconductor layer;
- a second insulation layer formed on said second semiconductor layer; and
- a third semiconductor layer formed on said second insulation layer and composing said control gate
- the third semiconductor layer, the second insulation layer, and the second semiconductor layer being etched using a single photoresist film as a mask,
- an insulating layer formed directly below said floating gate and said gate of said select field effect transistor and forming a tunneling gate oxide layer.

3. The non-volatile semiconductor storage apparatus according to claim 1, further comprising a drain diffusion layer shared between adjacent memory cell field effect transistors in a first direction in said unit cells.

4. The non-volatile semiconductor storage apparatus according to claim 2, further comprising a drain diffusion layer shared between adjacent memory cell field effect transistors in a first direction in said unit cells.

5. The non-volatile semiconductor storage apparatus of claim 1, further comprising:
- a source line commonly connecting sources of said select field effect transistors arranged in a first direction;
- a semiconductor layer connecting said source and said source line for said each select field effect transistor; and
- a drain diffusion layer shared between adjacent memory cell field effect transistors in a second direction in said unit cells.

6. The non-volatile semiconductor storage apparatus of claim 2, further comprising:
- a source line commonly connecting sources of said select field effect transistors arranged in a first direction;
- a semiconductor layer connecting said source and said source line for said each select field effect transistor; and
- a drain diffusion layer shared between adjacent memory cell field effect transistors in a second direction in said unit cells.

7. The non-volatile semiconductor storage apparatus of claim 1, wherein a common region forming the source of the memory cell field effect transistor and the drain of the select field effect transistor is defined by a tunnel insulating film of the memory cell field effect transistor and a gate insulating film of the select field effect transistor.

8. The non-volatile semiconductor storage apparatus of claim 2, wherein a common region forming the source of the memory cell field effect transistor and the drain of the select field effect transistor is defined by a tunnel insulating film of the memory cell field effect transistor and a gate insulating film of the select field effect transistor.

9. A non-volatile memory comprising:
- a semiconductor substrate;
- a select transistor including a gate insulating film defining a first region of said semiconductor substrate and a select gate formed on said gate insulating film;
- a tunnel insulating film defining a second region of said semiconductor substrate; and
- a memory transistor including a floating gate formed on said tunnel insulating film and extending to a position above said select gate, a common diffusion layer formed on a third region of said semiconductor substrate defined by said first region and said second region and shared with said select transistor and a control gate facing said floating gate.

* * * * *